(12) United States Patent
Villaume

(10) Patent No.: US 9,786,262 B2
(45) Date of Patent: Oct. 10, 2017

(54) PROGRAMMABLE NOISE REDUCING, DEADENING, AND CANCELATION DEVICES, SYSTEMS AND METHODS

(71) Applicant: Edward Villaume, Minneapolis, MN (US)

(72) Inventor: Edward Villaume, Minneapolis, MN (US)

( * ) Notice: Subject to any disclaimer, the term of this patent is extended or adjusted under 35 U.S.C. 154(b) by 0 days.

(21) Appl. No.: 15/190,431

(22) Filed: Jun. 23, 2016

(65) Prior Publication Data
US 2016/0379617 A1    Dec. 29, 2016

Related U.S. Application Data

(60) Provisional application No. 62/183,946, filed on Jun. 24, 2015.

(51) Int. Cl.
*G10K 11/178* (2006.01)
*H03G 3/02* (2006.01)

(52) U.S. Cl.
CPC ...... *G10K 11/178* (2013.01); *G10K 2210/108* (2013.01); *H03G 3/02* (2013.01); *H04R 2410/05* (2013.01); *H04R 2420/09* (2013.01); *H04R 2430/01* (2013.01); *H04R 2499/11* (2013.01)

(58) Field of Classification Search
CPC ............. G10K 11/178; G10K 11/1784; G10K 11/1788; G10K 2210/1081; G10K 2210/3044; G10L 21/0208; G10L 2021/02087; H04R 1/1083; H04R 3/04; H04R 1/025; H04R 1/08; H04R 2420/09; H03G 3/10
See application file for complete search history.

(56) References Cited

U.S. PATENT DOCUMENTS

| | | | |
|---|---|---|---|
| 2,043,416 A | 6/1936 | Lueg | |
| 2,983,790 A | 5/1961 | Olson | |
| 5,267,323 A | 11/1993 | Kimura | |
| 5,737,433 A | 4/1998 | Gardner | |
| 6,182,101 B1 | 1/2001 | Vahatalo et al. | |
| 6,501,843 B2 | 12/2002 | Usui et al. | |
| 6,597,792 B1 | 7/2003 | Sapiejewski et al. | |

(Continued)

OTHER PUBLICATIONS

International Search Report and Written Opinion issued for PCT/US2016/039206, mailed Sep. 14, 2016, 8 pages.

*Primary Examiner* — Brenda Bernardi
(74) *Attorney, Agent, or Firm* — Hamre, Schumann, Mueller & Larson, P.C.

(57) ABSTRACT

A noise cancelation device that programs, records, and saves sounds and noises and their respective sound waves, inverts them, and broadcasts the inverted sound waves, thereby reducing, deadening, canceling, or eliminating, the original sounds and noises, and their respective sound waves. Further, the noise cancelation device can save sounds and noises that have a constant, predictable, steady, and recognizable sound quality and their respective sound waves, and pre-program the respective inverted sound waves, which allows for the noise cancelation device to broadcast the preprogrammed inverted sound waves through speakers to reduce, deaden, or cancel the original sounds and noise when they are present. The noise cancelation device is portable and may be used in any location desired, or the noise cancelation device may be is fixed in its location.

20 Claims, 26 Drawing Sheets

(56) References Cited

U.S. PATENT DOCUMENTS

| | | |
|---|---|---|
| 6,668,062 B1 | 12/2003 | Luo et al. |
| 6,683,965 B1 | 1/2004 | Sapiejewski |
| 6,850,623 B1 | 2/2005 | Norris et al. |
| 7,088,830 B2 | 8/2006 | Norris et al. |
| 7,110,465 B2 | 9/2006 | Kaku et al. |
| 7,139,401 B2 * | 11/2006 | Culman ................ G11B 19/00 381/71.3 |
| 7,412,070 B2 | 8/2008 | Kleinschmidt et al. |
| 7,769,593 B2 | 8/2010 | Venkataraman et al. |
| 8,077,874 B2 | 12/2011 | Sapiejewski |
| 8,077,896 B2 | 12/2011 | Ross et al. |
| 8,126,189 B2 | 2/2012 | Liou et al. |
| 8,199,931 B1 | 6/2012 | Norris et al. |
| 8,233,633 B2 | 7/2012 | Kano |
| 8,335,318 B2 | 12/2012 | Pan |
| 8,798,284 B2 | 8/2014 | Cartwright et al. |
| 2001/0007591 A1 | 7/2001 | Pompei |
| 2007/0174645 A1 | 7/2007 | Lin |
| 2011/0274283 A1 | 11/2011 | Athanas |
| 2011/0274286 A2 | 11/2011 | McCarty et al. |
| 2012/0052924 A1 | 3/2012 | Cybart et al. |
| 2013/0287217 A1 | 10/2013 | Lee et al. |
| 2013/0321715 A1 | 12/2013 | Millson et al. |
| 2015/0146878 A1 * | 5/2015 | Meredith ............ G10K 11/178 381/71.6 |
| 2015/0294662 A1 * | 10/2015 | Ibrahim ............... G10K 11/178 381/71.6 |

* cited by examiner

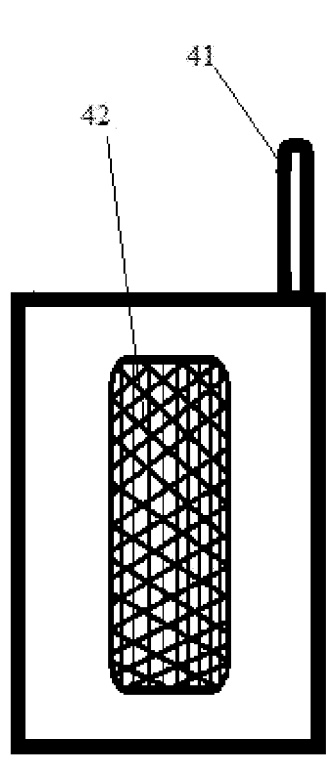
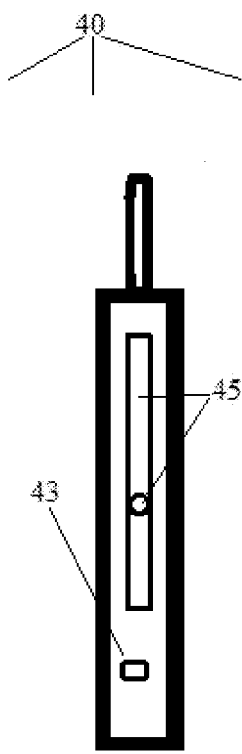
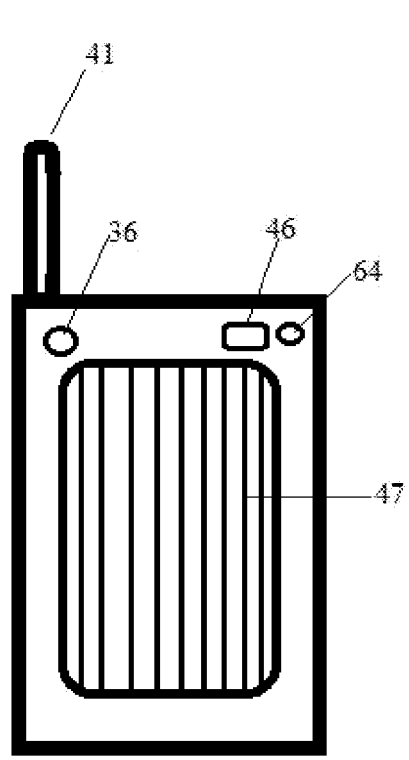
FIG. 6A    FIG. 6B    FIG. 6C
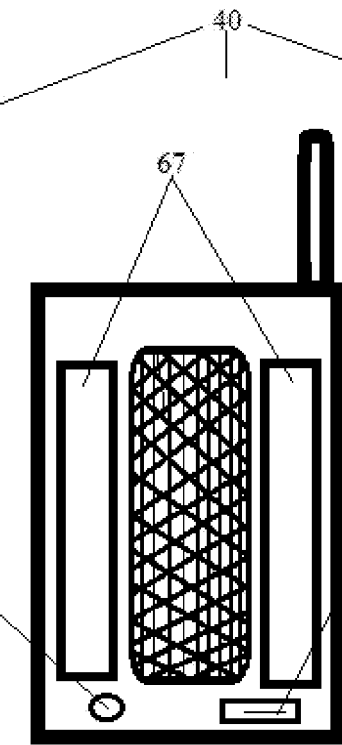
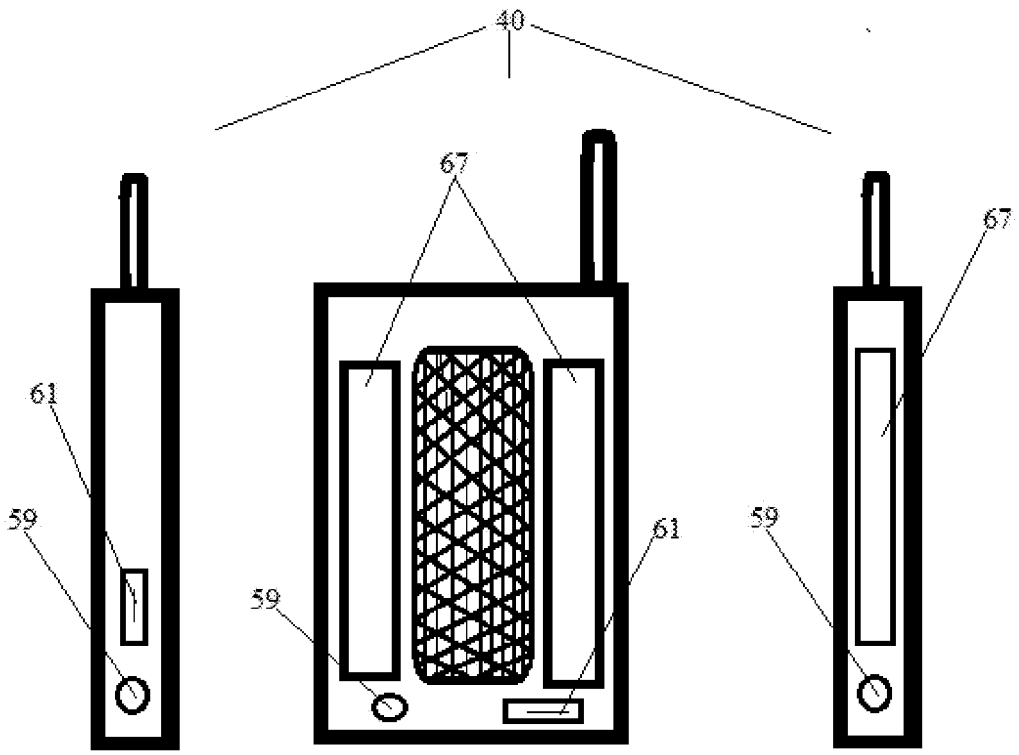
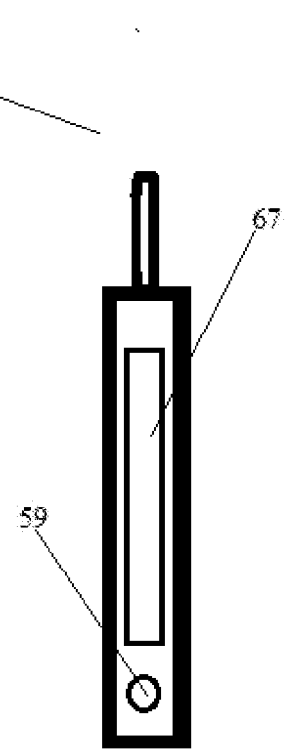
FIG. 6 D    FIG. 6 E    FIG. 6 F

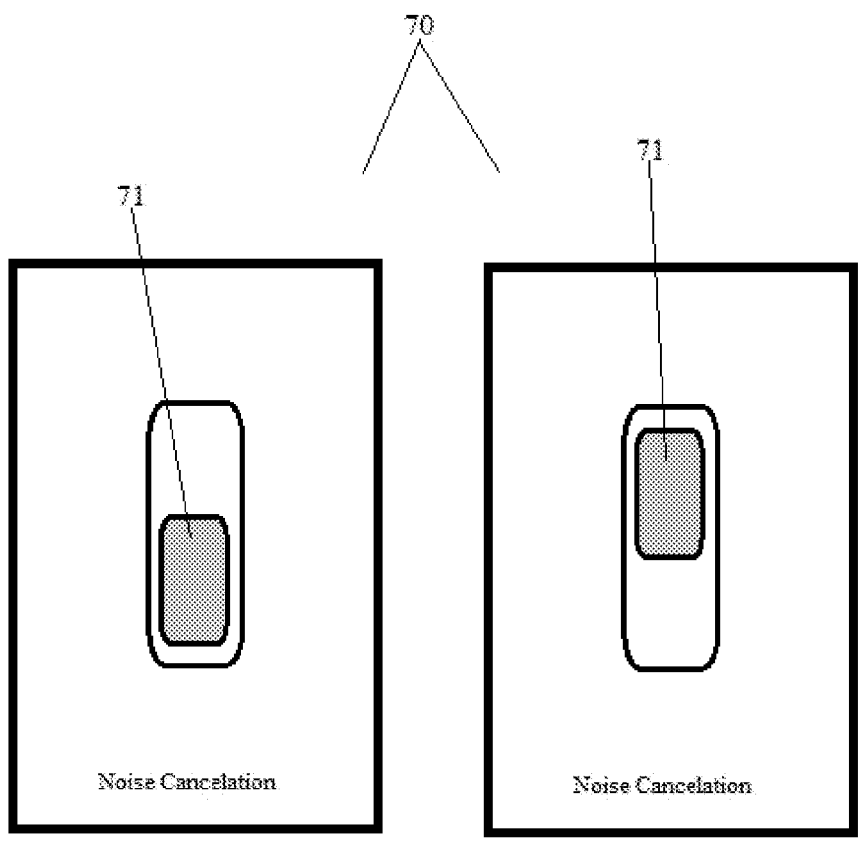

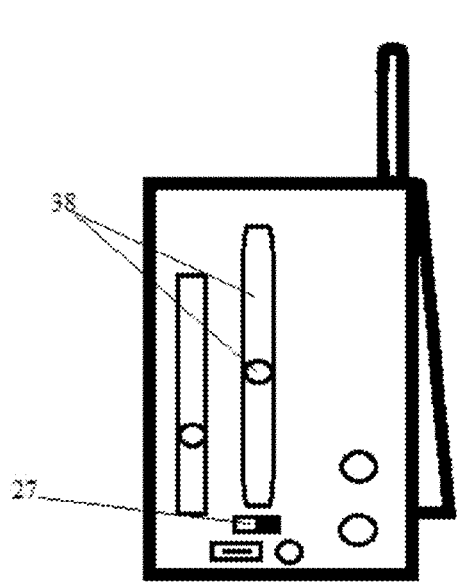 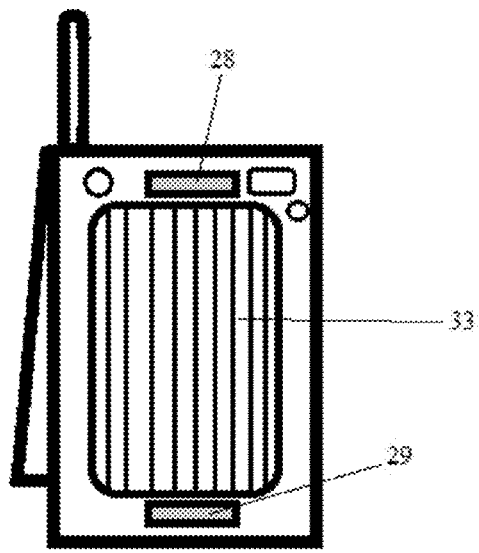
FIG. 16 A   FIG. 16 B
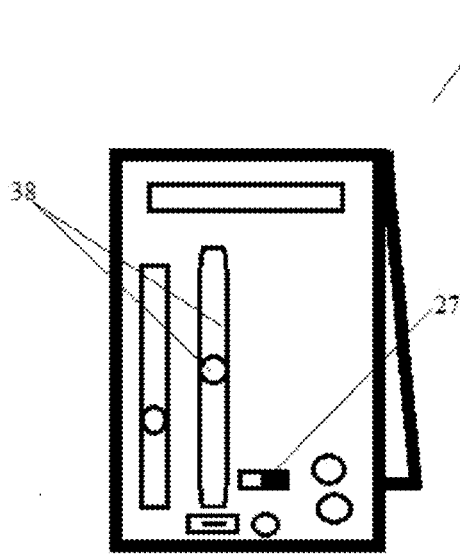 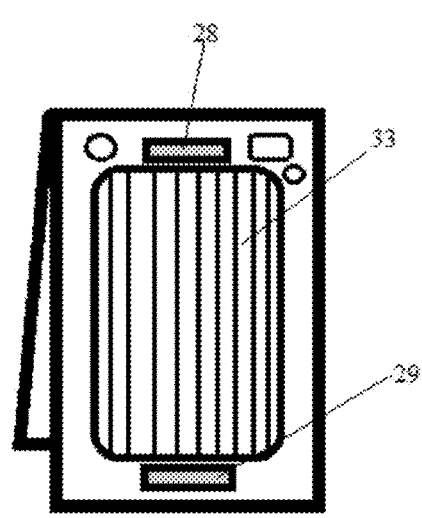
FIG. 16 C   FIG. 16 D

PROGRAMMABLE NOISE REDUCING, DEADENING, AND CANCELATION DEVICES, SYSTEMS AND METHODS

FIELD

For clarification purposes, if not explicitly stated to the contrary herein, references to sound(s), noise(s), and voice(s), includes the corresponding sound(s), noise(s), voice(s) waves.

This disclosure generally relates to noise cancelation and noise reducing apparatuses, devices in whole or any part thereof, and noise canceling methods to reduce or eliminate noise is different settings such as but limited to machine manufacturing warehouses, hotel rooms, personal homes, sporting events, restaurants, offices and meeting rooms, and any location where noise or sound may need to be reduced or canceled.

BACKGROUND

For as long as people have gathered in one location, there has been noise created from many different conversations occurring at the same time and in the same place. Loud or unwanted noise in restaurants and other social locations make it very difficult for some people to have a normal conversation because their ears hear all the noise and cannot filter out unwanted or distracting sounds and noise. This creates an environment of many loud voices, in many conversations, thereby making it difficult for people to hear or listen to the conversation in which they are engaged. There are noise canceling headphones, however wearing them in these situations is unrealistic, inconvenient, and would prevent conversations from taking place.

Further, for centuries loud high decibel noise has caused physical discomfort, damage and hearing loss, as well as disruption of conversations and communication. Constant noise at certain decibel levels is physically harmful and damaging to human ears and its hearing mechanisms. There are noise cancelling headphones, but not everyone may wear them, and they may not be available. There are ear plugs, but they may not fully insulate the ear from the noise, and ear plugs may make it difficult to communicate.

There are many unwanted sounds and noises when a person is trying to fall asleep, or is asleep. One problem with current technology is a person must wear noise canceling headphones to cancel or lessen the unwanted sounds, and wearing headphones is not conducive to sleep and comfort.

SUMMARY

A noise cancelation device is described that may use a programmable feature or a pre-programmable function with ability to save sound or noise waves, or use a real-time function as a means to reduce, deaden, or cancel the sound. The ability to preprogram or save sound waves and the inverted sound waves from sounds or noises that may occur frequently in an area or that have known frequencies or constant sound waves, decibels and other qualities, allows the described noise cancelation device to emit or broadcast the inverted noise or sound waves of the unwanted noise or sounds, thereby cancelling the sound waves and the respective sound or noise.

Because there may be more than one sound or noise a person desires to reduce, deaden, or cancel, in another embodiment the described noise cancelation device can have the ability to broadcast or emit more than one noise or sound cancelling wave at the same time, thereby cancelling more than one sound or noise at the same time.

In another embodiment, more than one noise or sound and its respective sound wave can be programmed into the noise cancelation device. The noise cancelation device can emit and broadcast pre-programmed inverted sound or noise waves, thereby reducing, deadening, or canceling the unwanted sounds or noise.

In another embodiment, the noise cancelation device can record and save sounds or noise, thereby recording and saving their respective sound waves. The ability to record and save sounds or noises allows a person or persons the ability to save or record unwanted sounds or noise, then "play", emit or broadcast the inverted sound waves or noise waves of the recorded sounds or noise, thereby reducing, deadening, or canceling the unwanted sounds or noise, and allowing the unrecorded sounds, voices, etc., to be heard more clearly.

In an embodiment, the noise cancelation device can include an automatic On/Off switch. When a device, machine or anything that creates noise is turned on, the noise cancelling device can immediately turn on, listen to the sounds or noise, immediately inverting the sound waves and immediately broadcasting the inverted sound waves, thereby reducing, deadening, or canceling the noise immediately. The noise cancelation device further allows for preprogrammed noise and sounds and their respective sound waves of a machine, device, or anything that creates sound or noise, and then when the machine, device, or anything is turned on and making its noise, the noise cancelation device notices the preprogrammed noise or sound and immediately broadcasts the inverted sound waves, thereby reducing, deadening, or canceling the preprogrammed sound or noise.

In another embodiment, the noise cancelling device can be turned on and off utilizing a wall-switch similar to those used every day in many buildings, rooms, etc.

In another embodiment, the noise cancelation device's on/off mechanism can have the ability to automatically turn off if there is no noise or sounds, and after a preset time period has elapsed.

In another embodiment, the noise cancelation device can have pre-programmed or saved sounds or noises, and when a pre-programmed sound or noise is detected in a location or pre-designated area, the noise cancelation device automatically turns on and immediately broadcasts the inverted sound waves, thereby reducing, deadening, or canceling the sound or noise.

The power needed for operation of the noise cancelation device may be A/C electrical power, D/C electrical power, rechargeable battery, non-rechargeable battery, or any source of power currently invented or to be invented in the future.

One or more microphones may be built in to the noise cancelation device, one or more microphones may be attached to the noise cancelation device, one or more microphones may be unattached and portable utilizing wireless communication; the microphone(s) may be one or more telescoping microphones, may be directional microphones, or may be any combination of the previously mentioned or other microphones invented or to be invented in the future.

In an embodiment, the noise cancelation device may attach to or be built into or onto eyeglasses, sunglasses or other items worn.

In an embodiment, the noise cancelation device may be portable, thereby allowing the noise cancelation device to be used in many environments.

In an embodiment, the noise cancelation device can be built-in or attached to, and not limited to, walls, ceilings, floors, machine equipment, countertops, and many other locations.

One or more of the noise cancelation devices can be used in one location. Because there may be unwanted sounds or noises coming from one or more locations, more than one noise cancelation device may be used, in sync or not in sync.

The noise cancelation device can utilize any audio speaker invented and to be invented in the future. The noise cancelation device may use portable speakers with wireless technology thereby allowing the speakers to be in a different location or position than the microphone(s), and stay in direct and immediate communication with the microphone(s) and the rest of the noise cancelation device. Thus having the ability to immediately reduce, deaden, or cancel unwanted sounds or noise by broadcasting the inverted sound waves of the unwanted sounds or noise.

In another embodiment, the noise cancelation device can include a remote control device that allows a user to make adjustments to the noise cancelation device remotely, or without having to touch the noise cancelation device. The noise cancelation device's remote control embodiment allows the user to engage a feature(s) of the noise cancelation device, such as the speaker(s) and the microphone(s), by selecting its equivalent on the remote control device. As an example, a user may select the record and save feature/option on the remote control which will engage the record and save feature/option on the noise cancelation device, thereby allowing the user to record and save noises/sounds the user wishes to record and save, and then cancel, reduce, or deaden those noises/sounds without having to touch the noise cancelation device. The remote control can be used with portable and non-portable noise cancelation devices and other noise cancelation devices described herein.

In another embodiment, the noise cancelation device can connect and be controlled remotely via other remote control devices including, but not limited to, a mobile device(s) such as a smart phone, tablet(s) computer, laptop computer, personal computer(s), and other remote control devices. Communication with the noise cancelation device may be via wireless technology such as Bluetooth technology, and other wireless activating/connecting technology. The noise cancelation device can be controlled and its features accessed, operated, added (when available), updated (when available), and changed through the aforementioned technology.

In another embodiment, the noise cancelation device can allow a person to record a sound(s), noise(s), or voice(s) into the noise cancelation device. The user can engage the record feature by depressing the designated button on the noise cancelation device, or noise cancelation device's remote control. The user may use the record feature to record a sound(s), noise(s), or voice(s) and then when the record feature is disengaged or turned off, the noise cancelation device will cancel, reduce, or deaden the recorded sound(s), noise(s), and voice(s). The noise cancelation device can cancel, reduce, or deaden multiple sounds, noises, and voices in combination or separately.

In another embodiment, the noise cancelation device may have built-in data storage capacity to allow for the ability to store data in the noise cancelation device. The data storage capability of the noise cancelation device may utilize permanent memory or storage technology built-in to the noise cancelation device. The noise cancelation device may also or alternatively utilize removable memory and storage technology, thereby allowing the user to remove and replace memory and storage technology. The noise cancelation device may utilize both permanent and removable memory technology separately or in combination.

In another embodiment, the noise cancelation device can allow a person to save sounds, noises, or voices into the noise cancelation device. To save a sound(s), noise(s), or voice(s), the user engages the record feature and then uses the save feature to save and store the recorded sound(s), noise(s), or voice(s) into the noise cancelation device's permanent or removable memory or storage device. The user has the option to customize the identity or to create a name or title of the saved sound(s), noise(s), voice(s) to make it easier to select it for cancelation at another time. The user may use the default number or title automatically created by the noise cancelation device to label what's intended to save. The noise cancelation device's save feature may be activated directly on the noise cancelation device or remotely via the noise cancelation device's remote control, or remotely via portable devices, tablets, computers, and other devices not attached to the noise cancelation device. The saved sound(s), noise(s), voice(s) may then be selected from the memory feature of the noise cancelation device and accessed at a different time to cancel, reduce, or deaden selected saved sound(s), noise(s), or voice(s). The save feature of the noise cancelation device may be used for a current noise situation, and/or may be saved for future use.

In another embodiment, the noise cancelation device has an allow-only feature that allows only the selected or saved sound(s), noise(s) voice(s) to be heard and all other sounds, noises and voices will be substantially cancelled, reduced, deadened, thereby allowing the individual(s) to hear each other easier. The allow-only feature can be used by selecting the allow-only feature on the noise cancelation device or select the allow-only feature remotely, thereby giving the user the option to select a previously stored sound, noise, voice from the noise cancelation device's memory, or the user(s) may press the allow-only feature to immediately record their voices, save them, and allow only the selected sounds to be heard, all other sounds, noises, voices will be cancelled, reduced, deadened. The allow-only feature allows two or more people to engage in a conversation in a noisy area by canceling unwanted sounds, noises, voices. The noise cancelation device's allow-only feature may use other previously described embodiments of the noise cancelation device.

In another embodiment, the noise cancelation device has a cancel-only feature that cancels only the selected sound(s), noise(s), or voice(s). An example of the cancel-only feature would be when two or more people would like to have a private conversation and not allow their conversation to be heard by others. The users would select the cancel-only feature on the noise cancelation device, the people would speak and the noise cancelation device would record and save the respective sound waves. When the cancel-only feature is engaged to the activated selection, the people can speak and their voices will be cancelled, allowing all other sounds to be heard. The cancel-only feature utilizes the noise cancelation device's speaker system to direct the inverse sound waves away from the conversation, allowing the designated people to hear and others to not hear the conversation.

In another embodiment, the noise cancelation device has the ability to cancel, reduce, or deaden sounds, noise, and voices in real-time, as active noise cancelation. Active noise cancelation may be used in any or all variations of the noise cancelation device. The noise cancelation device receives sounds, noise, voices via its microphone(s), immediately inverts the respective sound waves and broadcasts the inverted sound waves through its or other speaker(s), thereby canceling, reducing, deadening the unwanted sounds, noise, voices.

In another embodiment, the noise cancelation device may be portable. In one embodiment, the portable noise cancelation device may have the ability to open via hinges to allow it to be placed over something, such as the back of a chair, with the speaker(s) of the noise cancelation device on one side of the back of the chair and the microphone(s) on the opposite side. This would allow the user to place the chair and noise cancelation device in between the source of the noise and the user, with the microphone(s) facing the source of the sound and the speaker(s) facing the user. When the noise cancelation device is turned on, the noise cancelation device receives the sounds, noise, or voices through the microphone, and broadcasts the inverted sound waves through the speakers, thereby canceling, reducing, deadening the received sounds, noise, and voices.

In another embodiment, the noise cancelation device can have one or more Universal Serial Bus (USB) ports. The USB port(s) allows the noise cancelation device to export or import data, such as but not limited to, saved voices. The USB port may be used to recharge a battery of the noise cancelation device when a USB cord is attached to the noise cancelation device and a computer, or tablet, or other device. The USB port can be used to update the software, drivers, etc. The USB port can be used to move saved data to/from one noise cancelation device to another noise cancelation device via a USB drive or other USB devices. These are examples of some of the uses for the USB port of the noise cancelation device and are not intended to limit the USB port(s) to these examples only.

In another embodiment, the noise cancelation device can have ports, plugs, and accessible features and mechanisms that allow lights, controls, features to function, update, move, etc.

In another embodiment, the noise cancelation device can have a control panel that is digital. The digital control panel allows for several standard features, several additional features, dropdown menus, and other features that can be the same as an analog control. The digital control can be control by a remote control device.

In another embodiment, the noise cancelation device can have a control panel that is a touchscreen.

In another embodiment, the noise cancelation device can connect to the internet, intranet, and other networks. This can allow the noise cancelation device to receive downloads, updates, and other data.

In another embodiment, the noise cancelation device can use wireless technology, ports for connection to the internet or external devices, wireless internet connection, intranet connections, wired or other connections.

DRAWINGS

To enable a further understanding of the different aspects and the technological features described herein, the brief description of the drawings below is followed by the detailed description.

Figure 4:
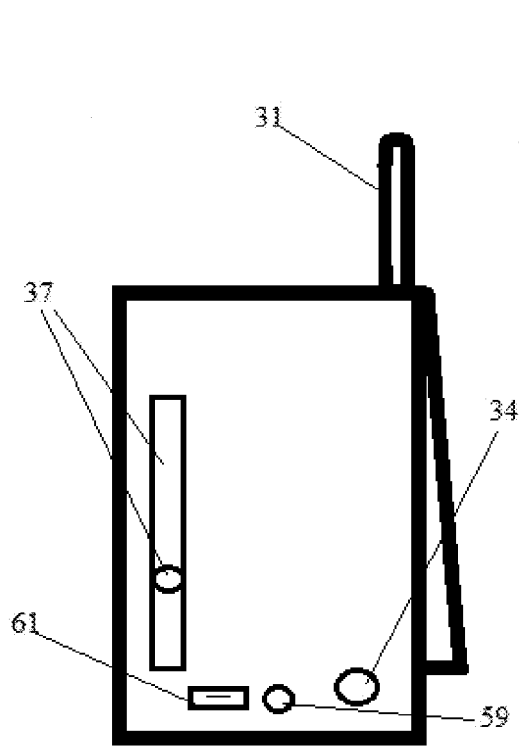
Figure 4:
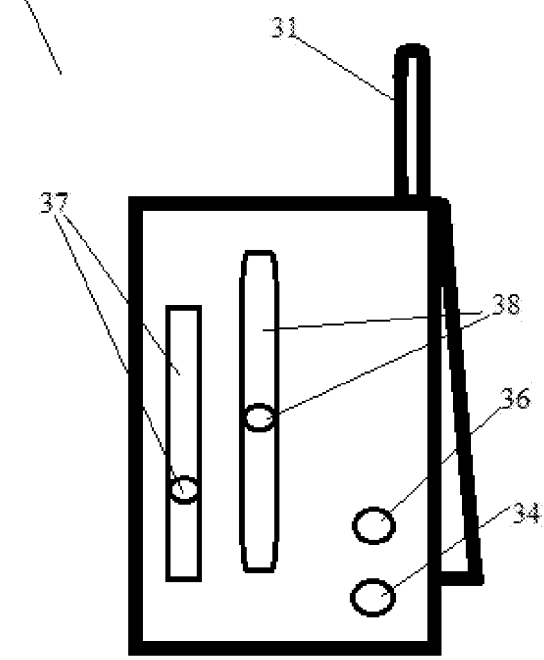
Figure 4:
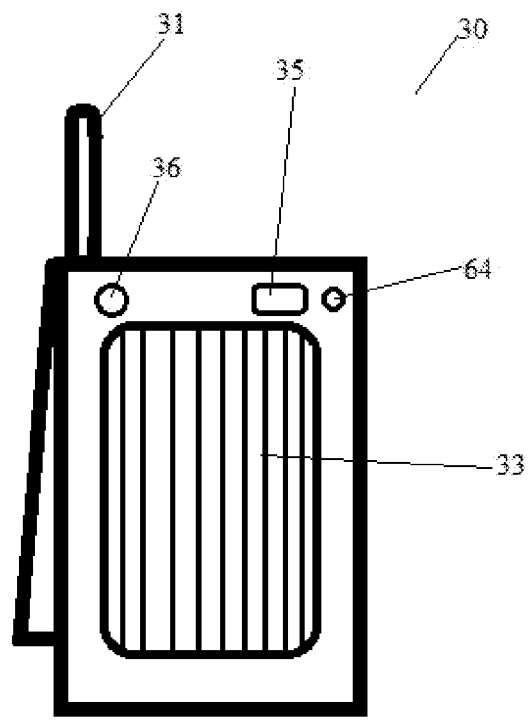

FIGS. 4A, 4B, and 4C show front and back views of a portable foldable version of the noise cancelation device with one example of an extendable or telescopic microphone.

Figure 5:
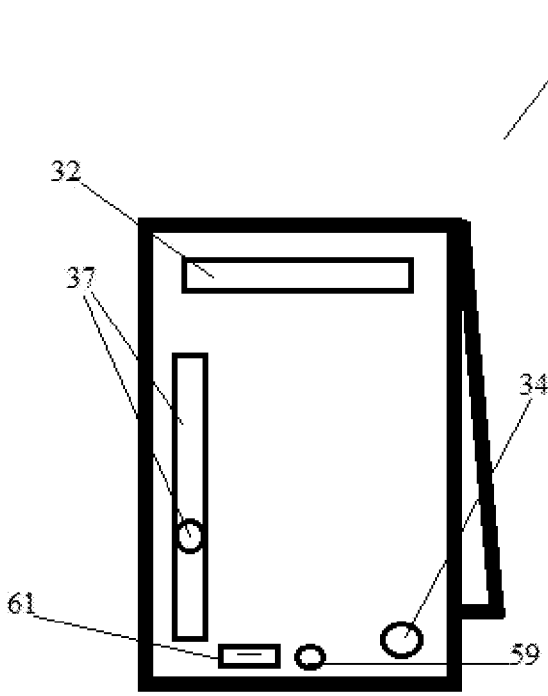
Figure 5:
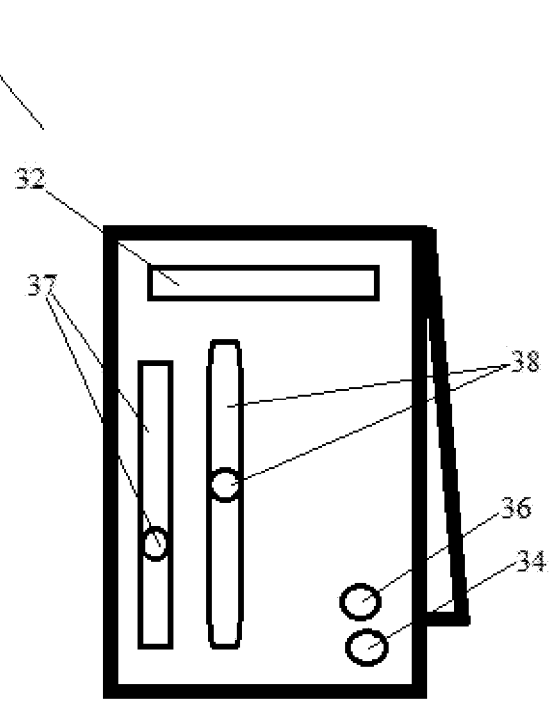
Figure 5:
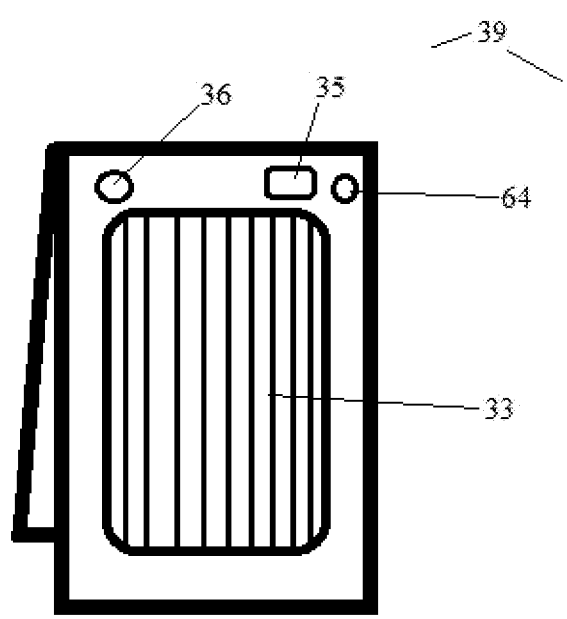
Figure 5:
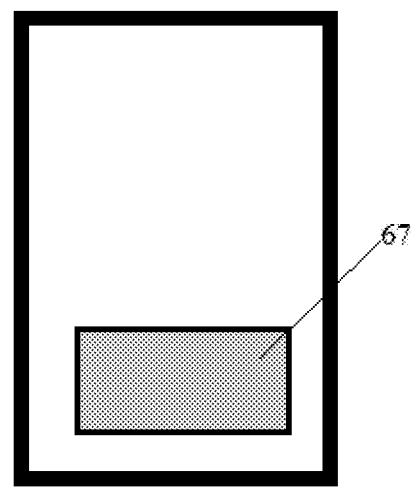

FIGS. 5A, 5B and 5C show front and back views of another portable foldable version of the noise cancelation device with one example of a built-in microphone.

FIG. 5D shows a battery compartment for the portable noise cancelation device of FIGS. 5A-C.

FIGS. 6A, 6B, 6C show back, side, and front views, respectfully, of an embodiment of a noise cancelation device with an example of an attachment mechanism and an extendable or telescopic microphone.

FIGS. 6D, 6E, 6F show side, back, and side views, respectfully, of an embodiment of a noise cancelation device.

Figures 7A, 7B, 7C:
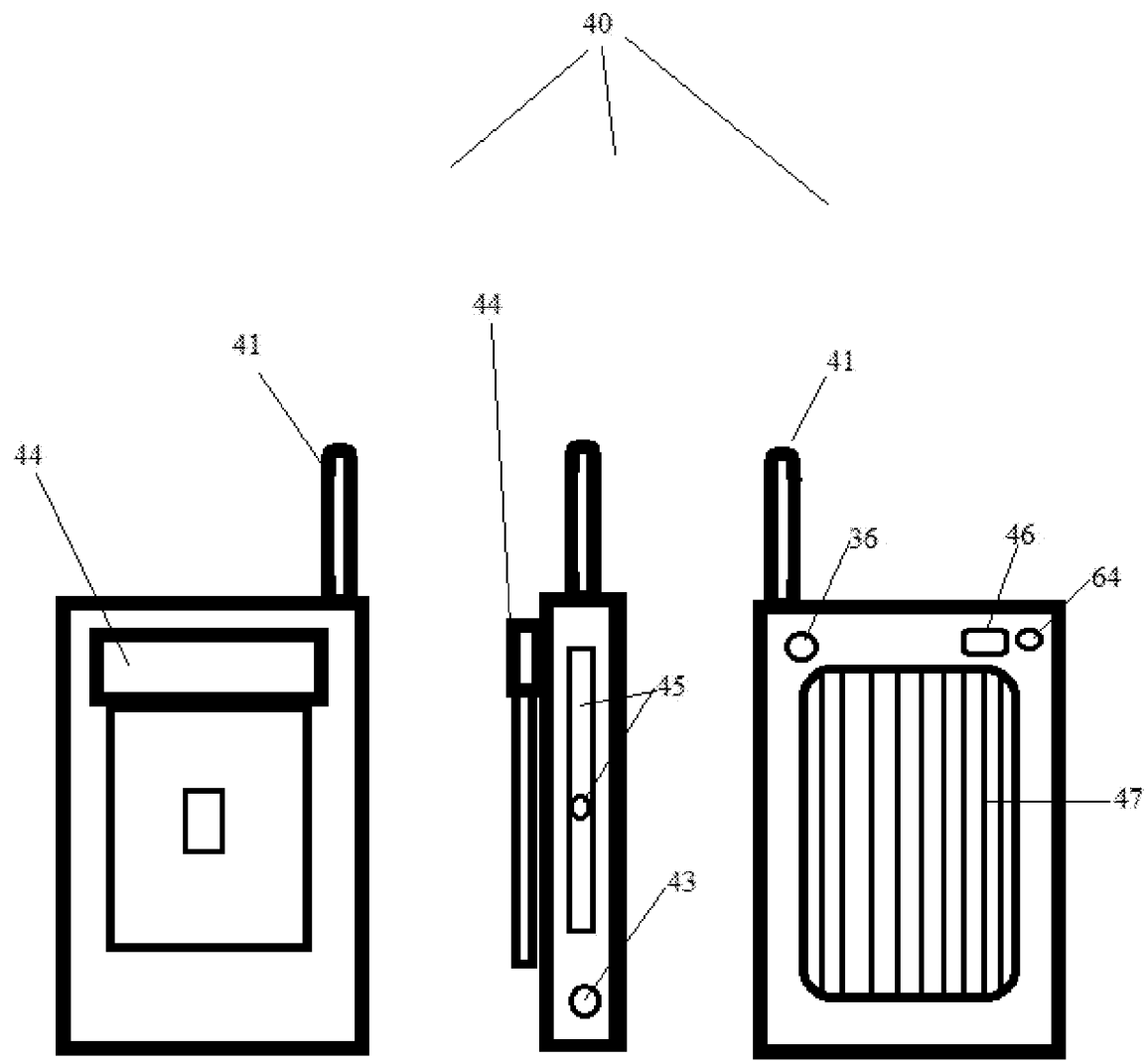

FIGS. 7A, 7B, 7C show back, side, and front views, respectfully, of an embodiment of a noise cancelation device with a clipping attachment mechanism and an extendable or telescopic microphone.

Figure 8:
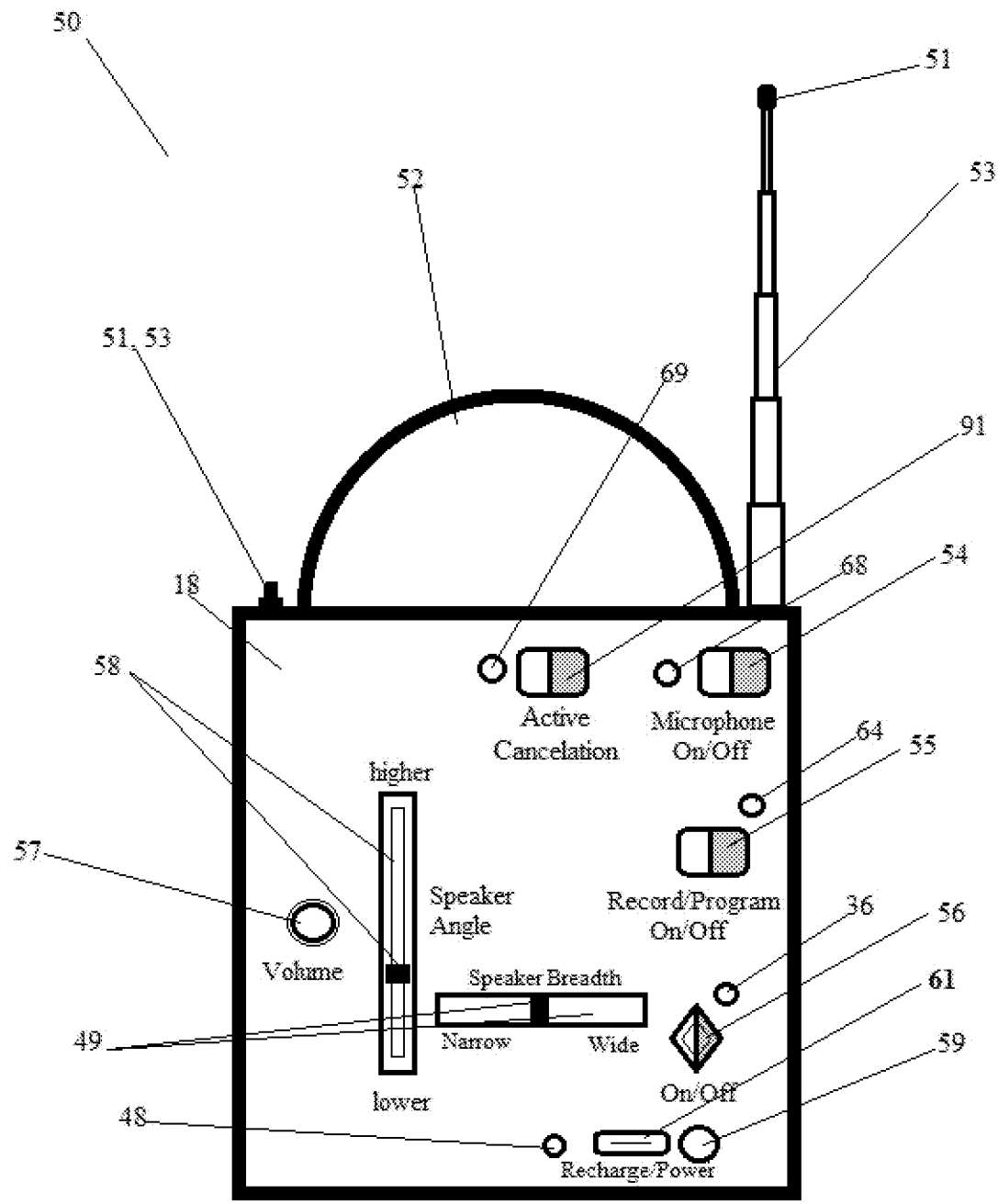
Figure 8:
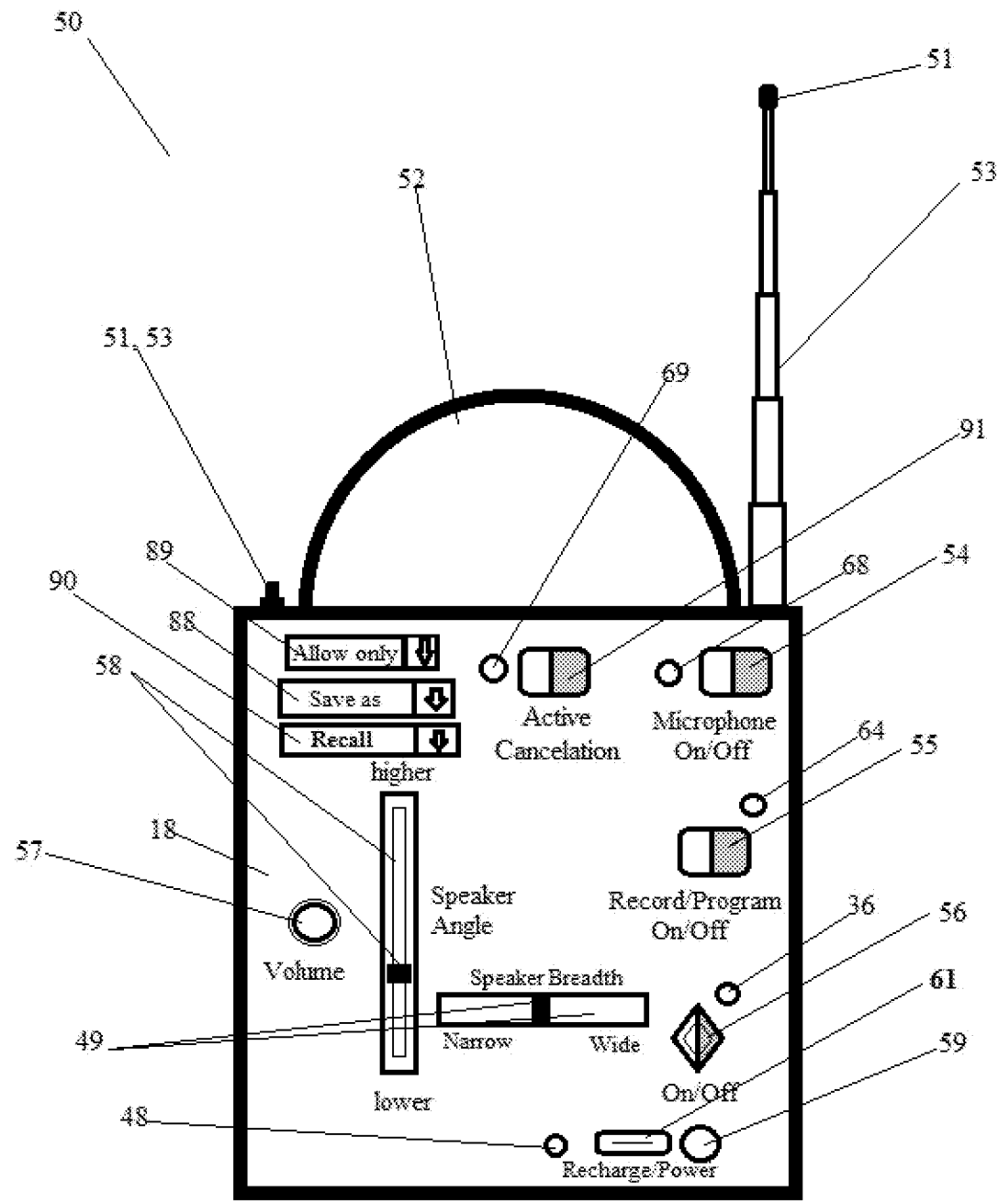

FIG. 8A shows a side view of another embodiment of the noise cancelation device with telescoping directional microphones and directional speakers.

FIG. 8B shows a side view of another embodiment of the noise cancelation device with telescoping directional microphones and directional speakers.

Figure 9:
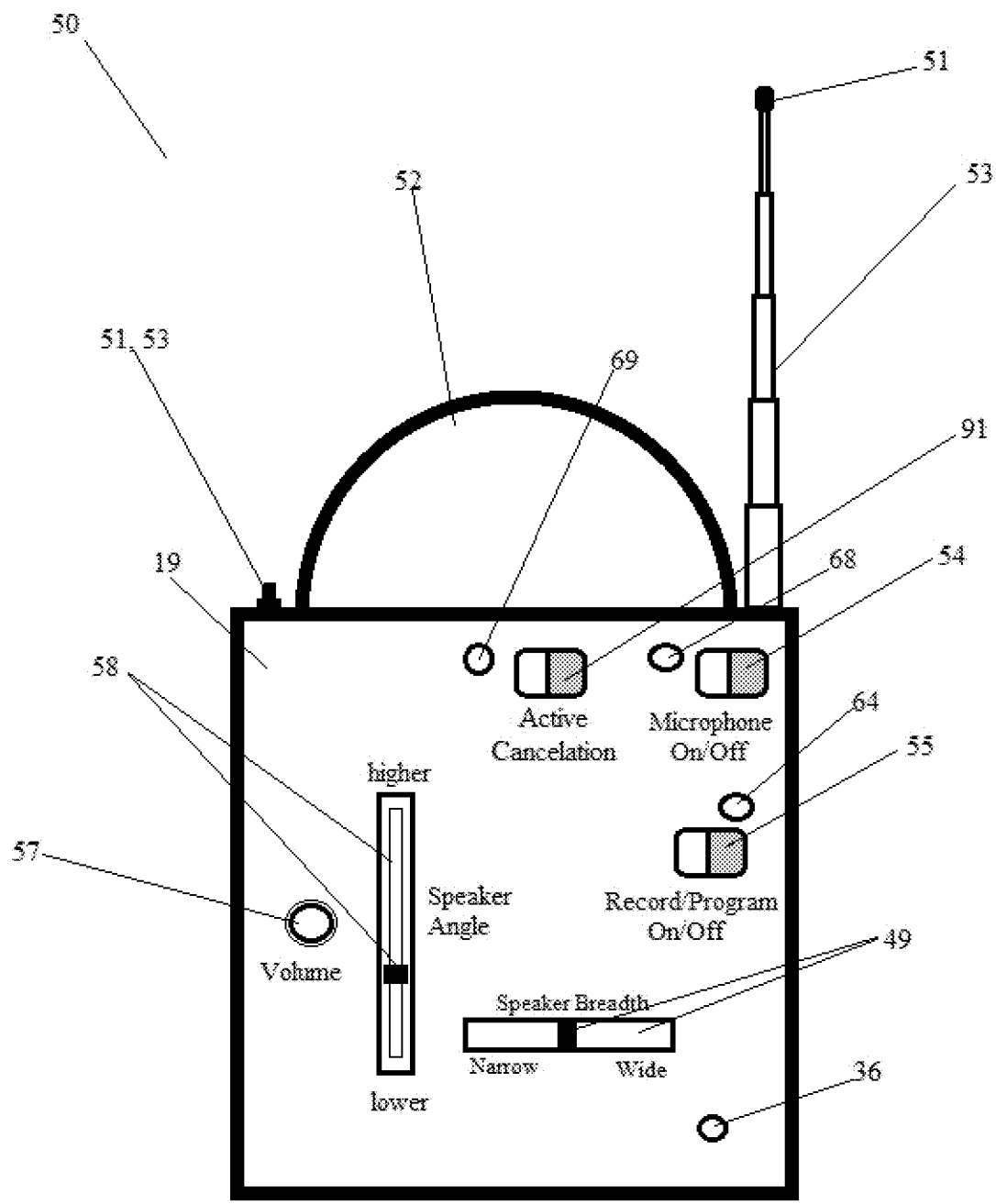
Figure 9:
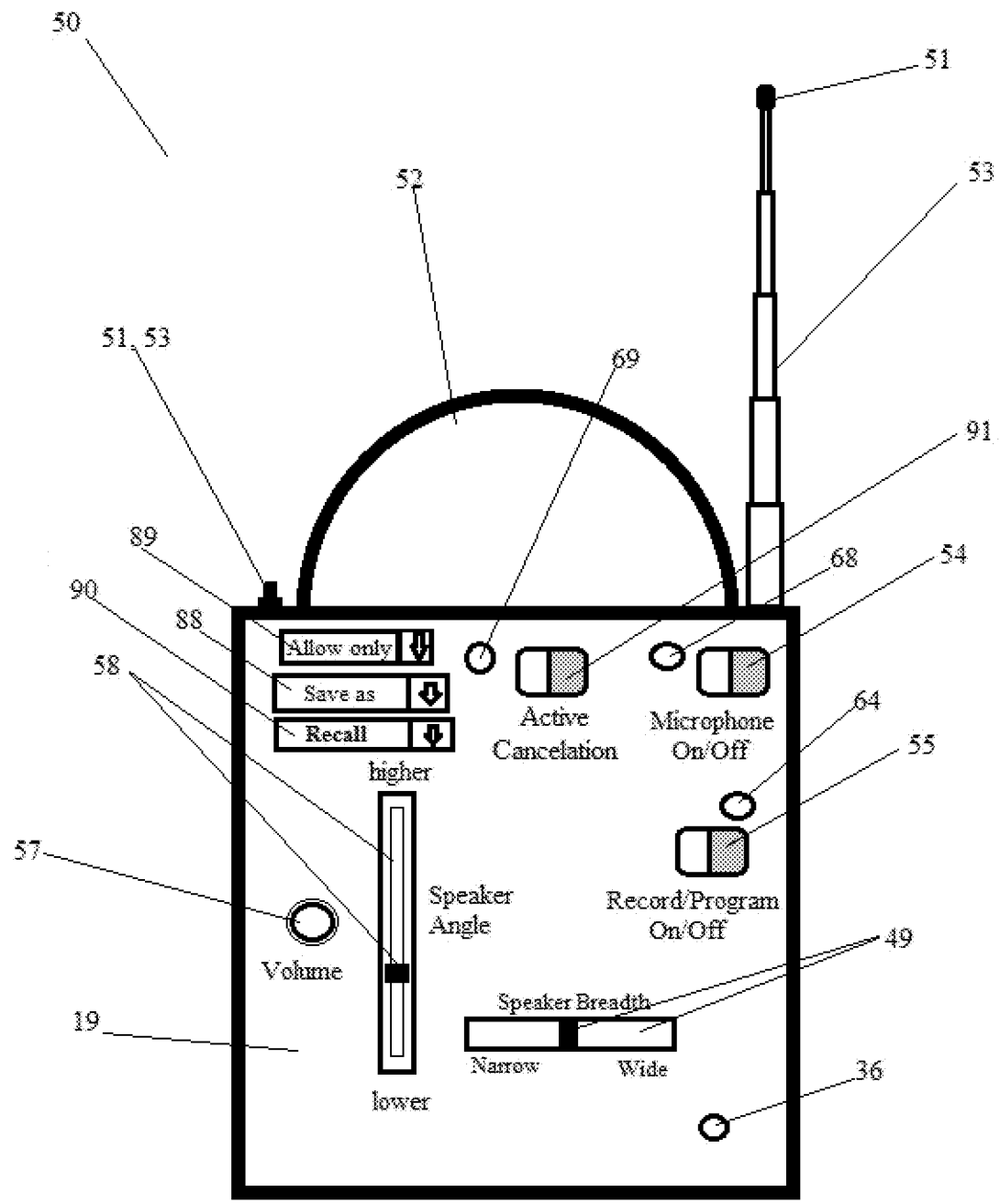

FIG. 9A shows a side view of another embodiment of the noise cancelation device with telescoping microphones and directional speakers.

FIG. 9B shows a side view of another embodiment of the noise cancelation device with telescoping microphones and directional speakers.

Figure 10:
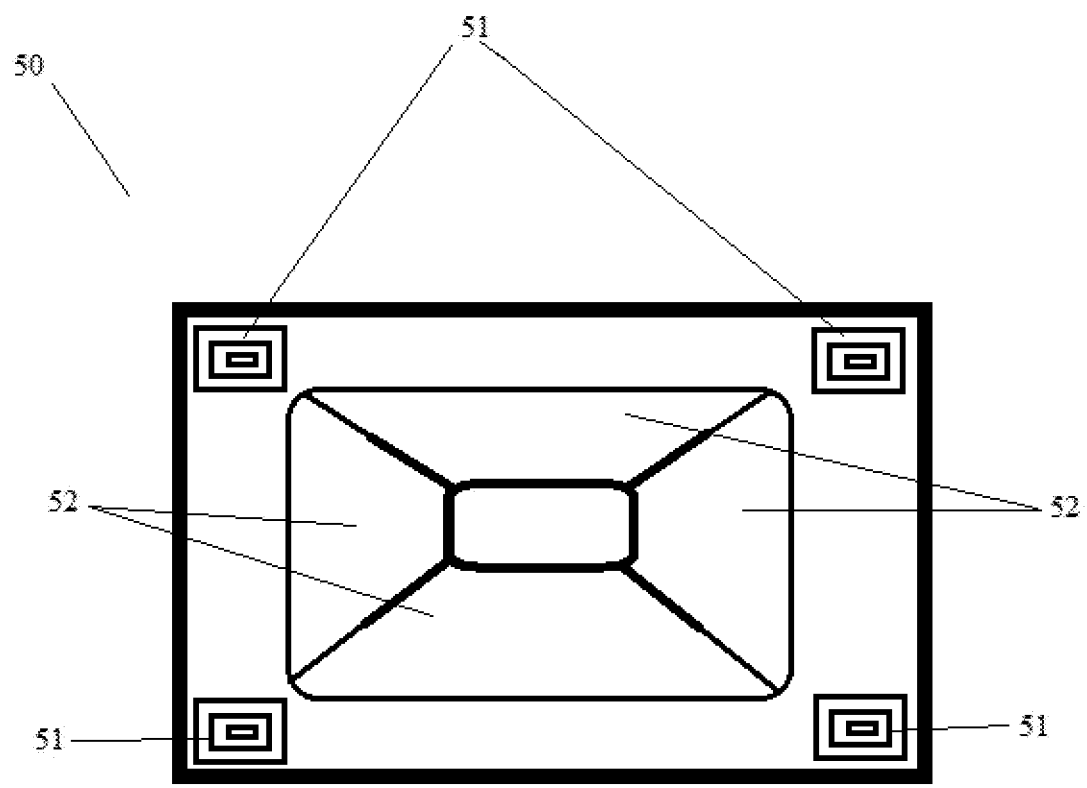

FIG. 10 shows an overhead view of the noise cancelation device of FIGS. 8A-B and 9A-B with telescoping directional microphones and directional speakers.

FIGS. 11A and 11B show a wall switch in on and off positions.

Figure 12A:
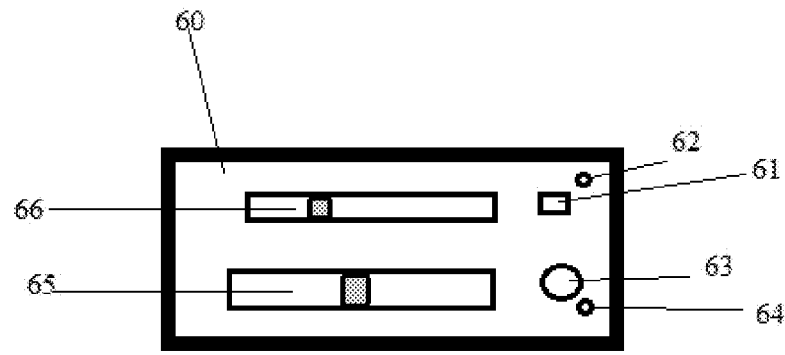
Figure 12:
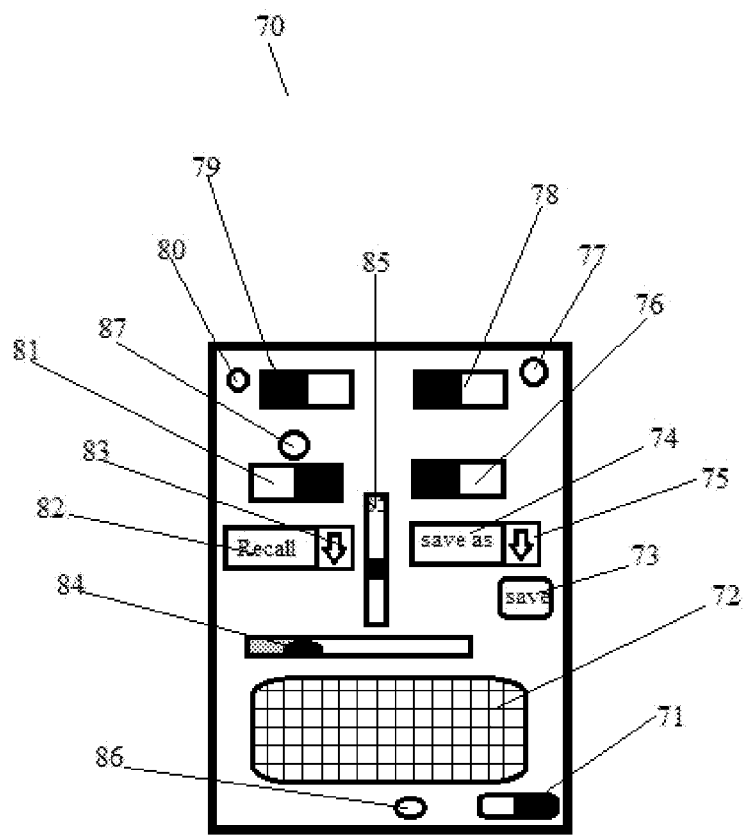

FIGS. 12A and 12B show top and overhead views, respectively, of a remote control device(s) that can be used with the noise cancelation device(s).

Figure 13:
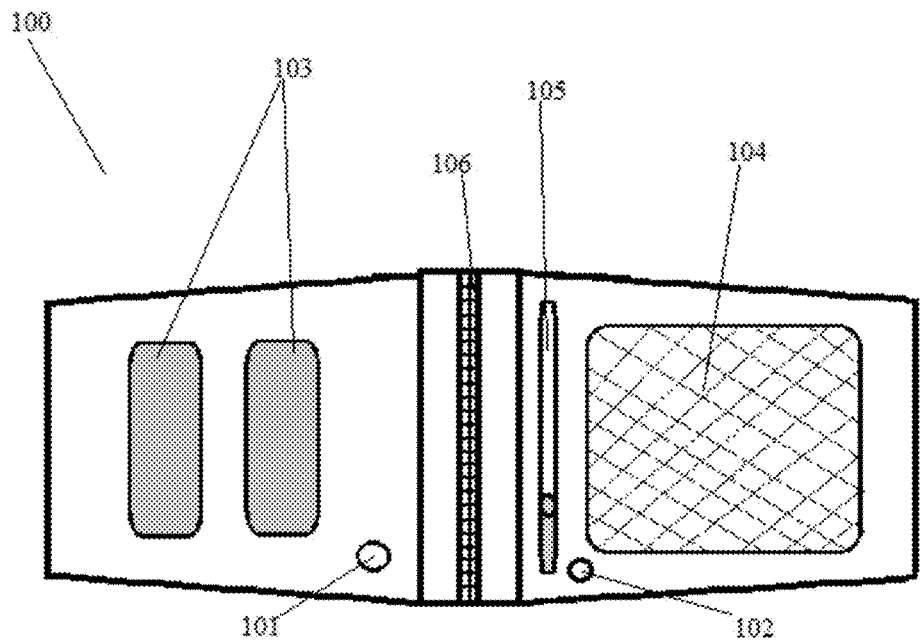
Figure 13:
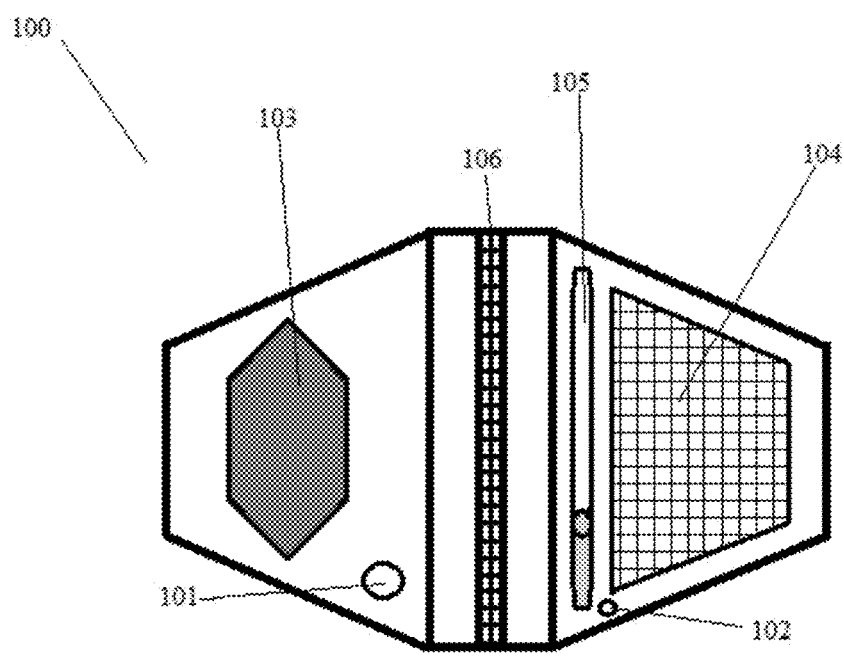

FIGS. 13A and 13B show top views of different embodiments of a portable flip-open noise cancelation device in partially opened configuration.

Figure 14:
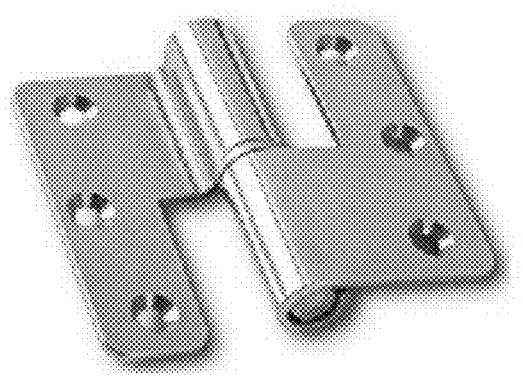

FIG. 14 shows a slip joint hinge that can be used in the foldable embodiment of the noise cancellation device.

Figure 15:
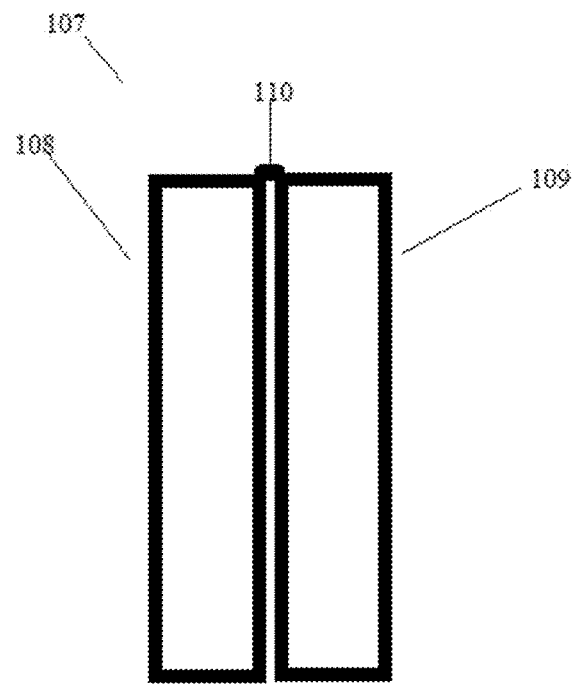
Figure 15:
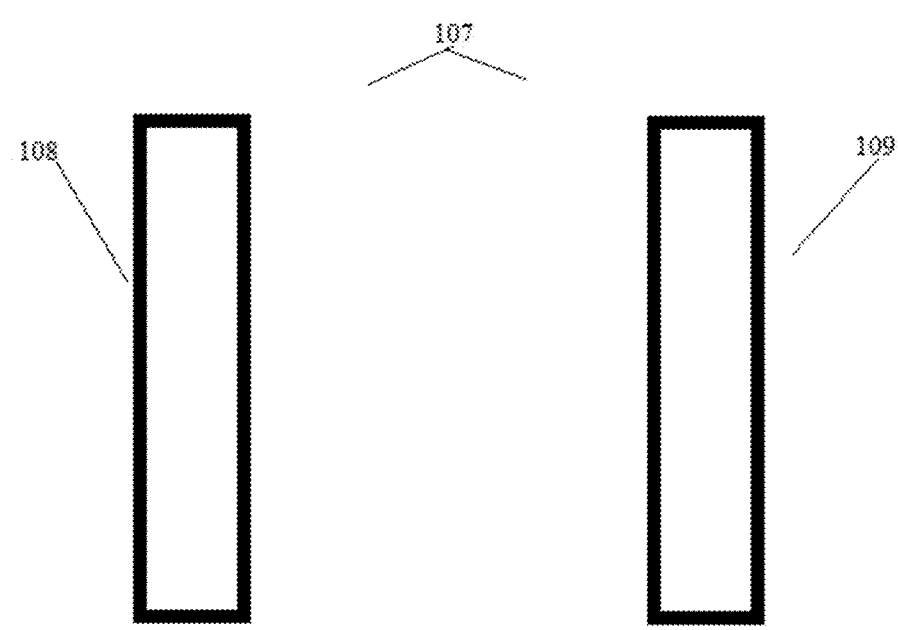

FIGS. 15A and 15B show side views of the portable flip-open noise cancelation device.

FIGS. 16A, 16B, 16C, and 16D show front and back views of additional embodiments of the portable foldable noise cancelation device(s).

FIGS. 17A, 17B, 17C, and 17D show front and back views of additional embodiments of the portable foldable noise cancelation device(s).

Figure 18:
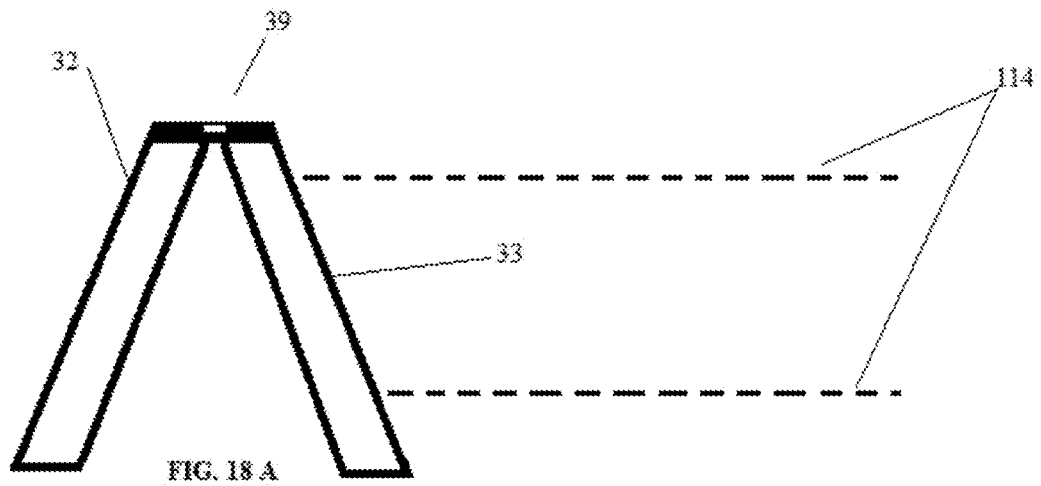
Figure 18:
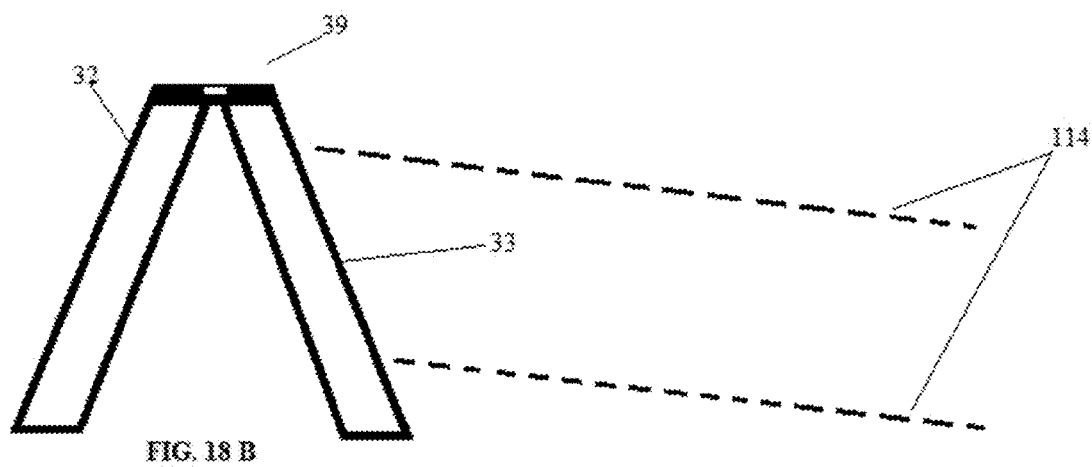
Figure 18:
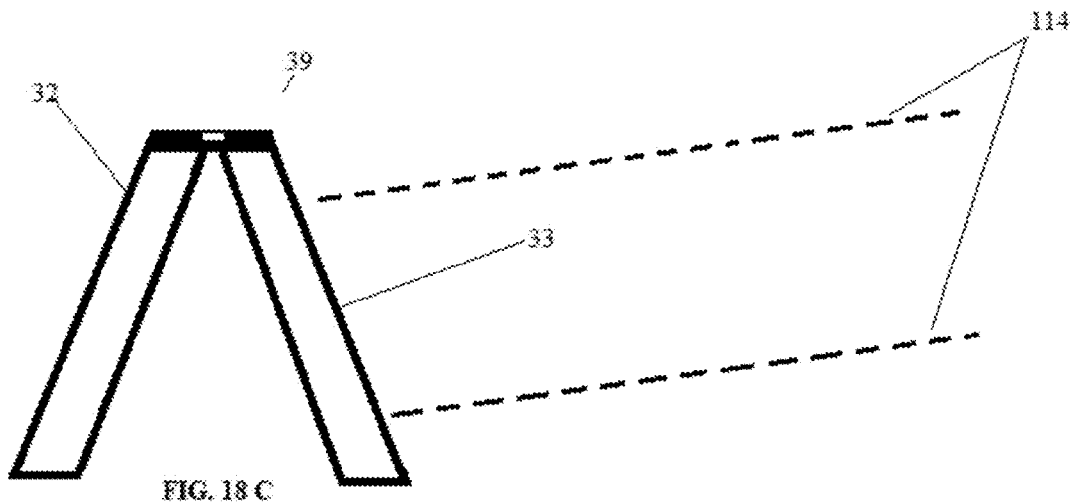

FIGS. 18A, 18B, and 18C show side views of another embodiment of the portable foldable noise cancelation device.

Figure 19:
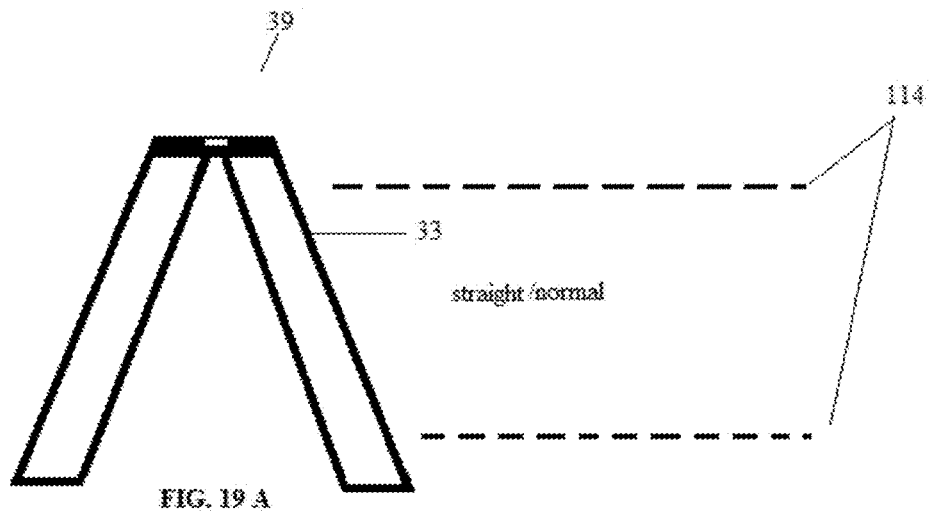
Figure 19:
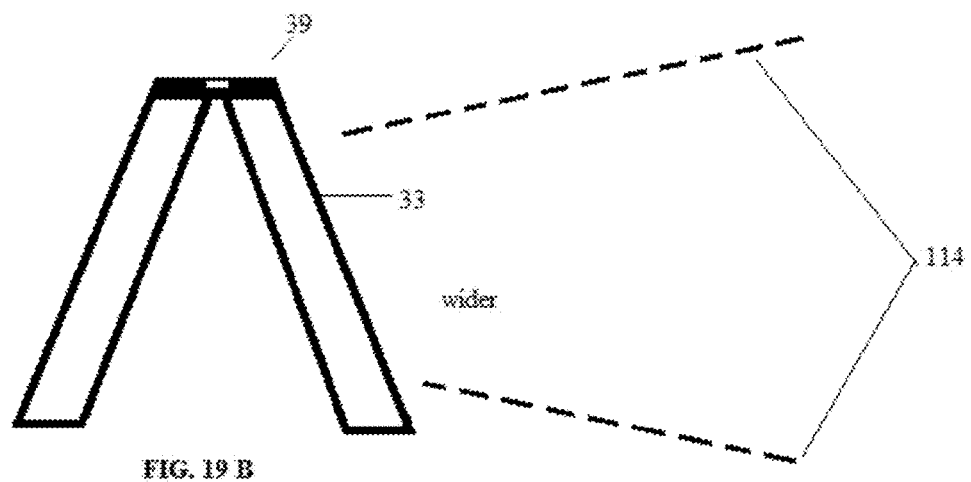
Figure 19:
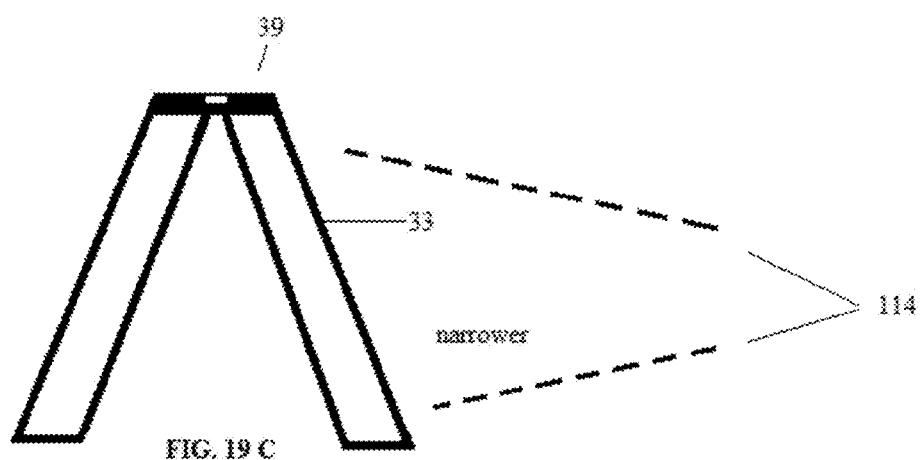
Figure 19:
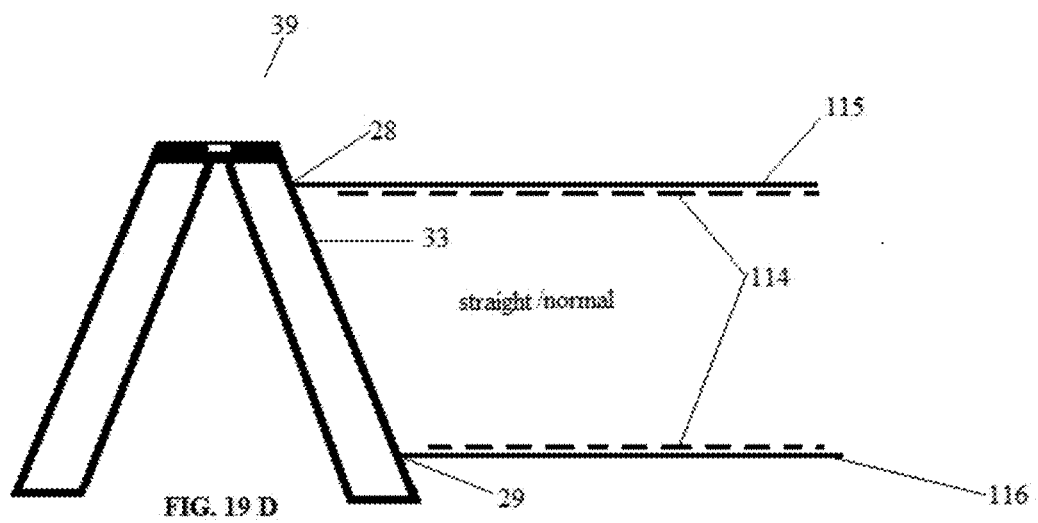
Figure 19:
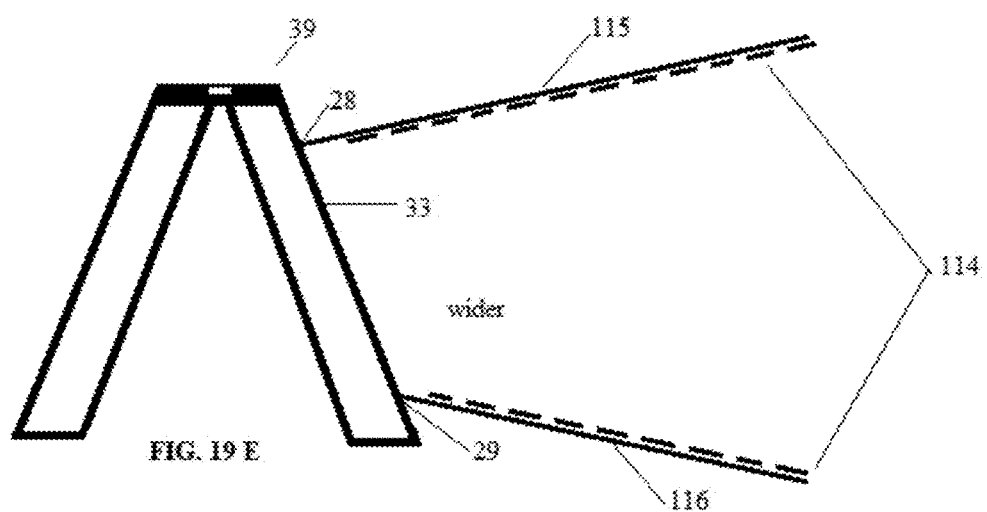
Figure 19:
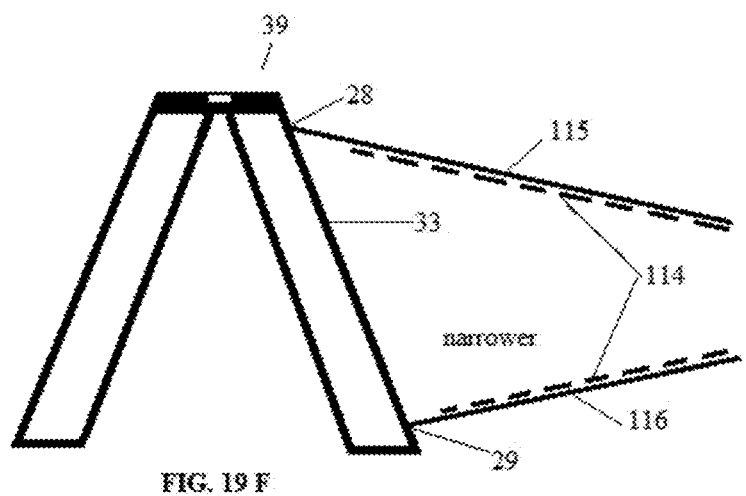

FIGS. 19A, 19B, and 19C show side views of another embodiment of the portable foldable noise cancelation device.

FIGS. 19D, 19E, and 19F show side views of another embodiment of the portable foldable noise cancelation device.

Figure 20:
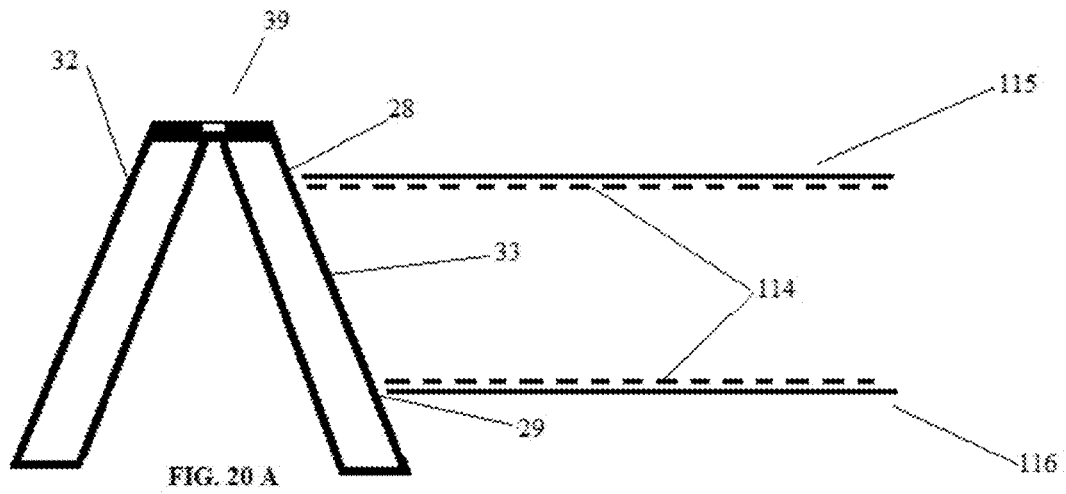
Figure 20:
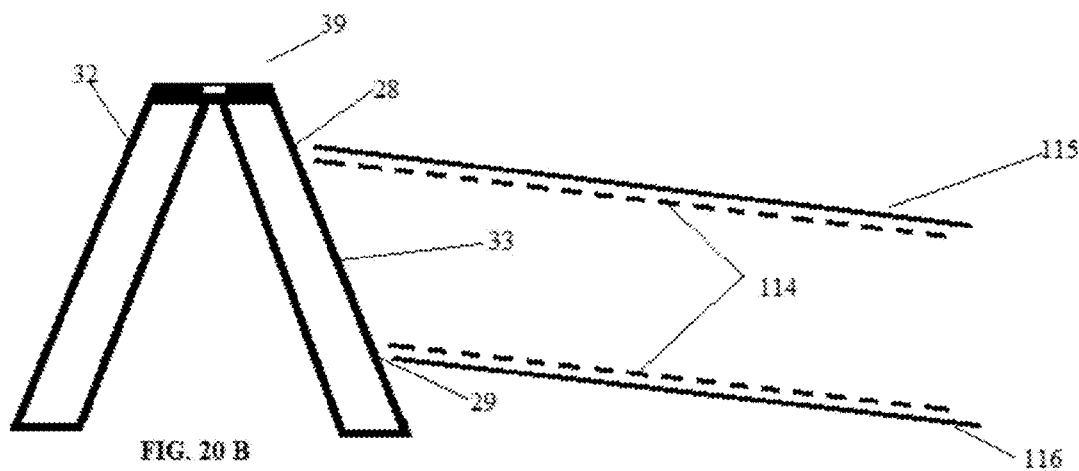
Figure 20:
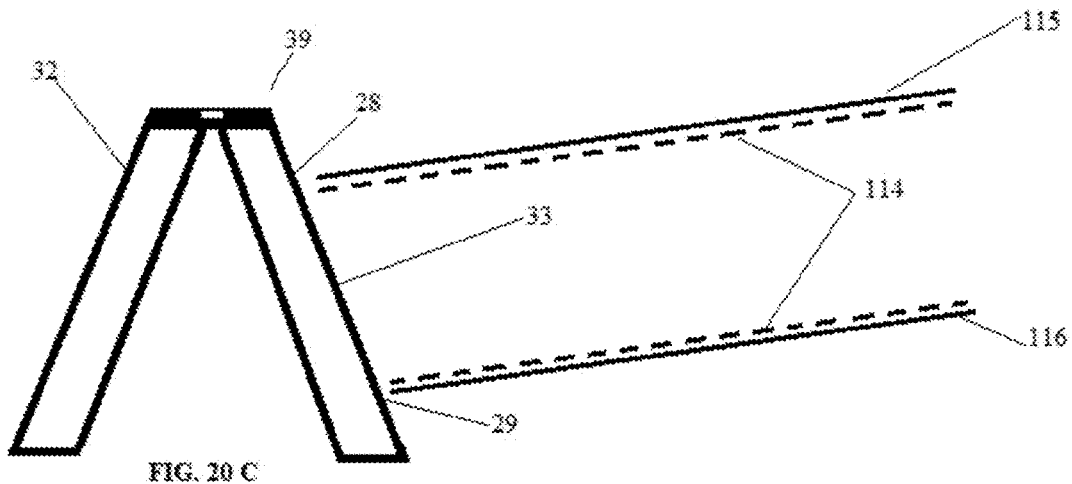

FIGS. 20A, 20B, and 20C show side views of another embodiment of the portable foldable noise cancelation device.

FIGS. 21A, 21B, 21C, and 21D show front and back views of additional embodiments of the portable foldable noise cancelation device.

Figure 22:
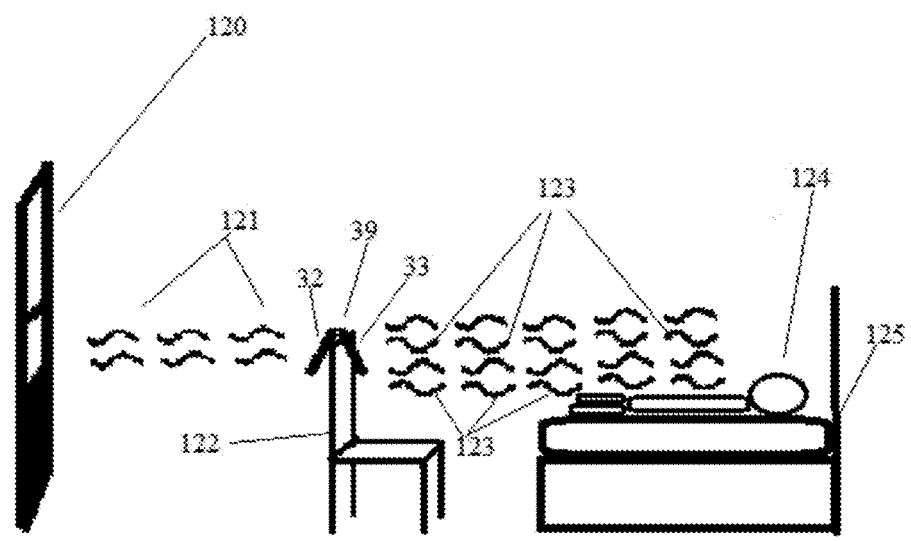

FIG. 22 shows a side view of an example of the portable foldable noise cancelation device in use.

DETAILED DESCRIPTION

Selected embodiments will now be explained with reference to the drawings. It will be apparent to those skilled in the art from this disclosure that the following descriptions of the embodiments are provided for illustration only and not for the purpose of limiting the claimed invention as defined by the appended claims and their equivalents.

Figure 1:
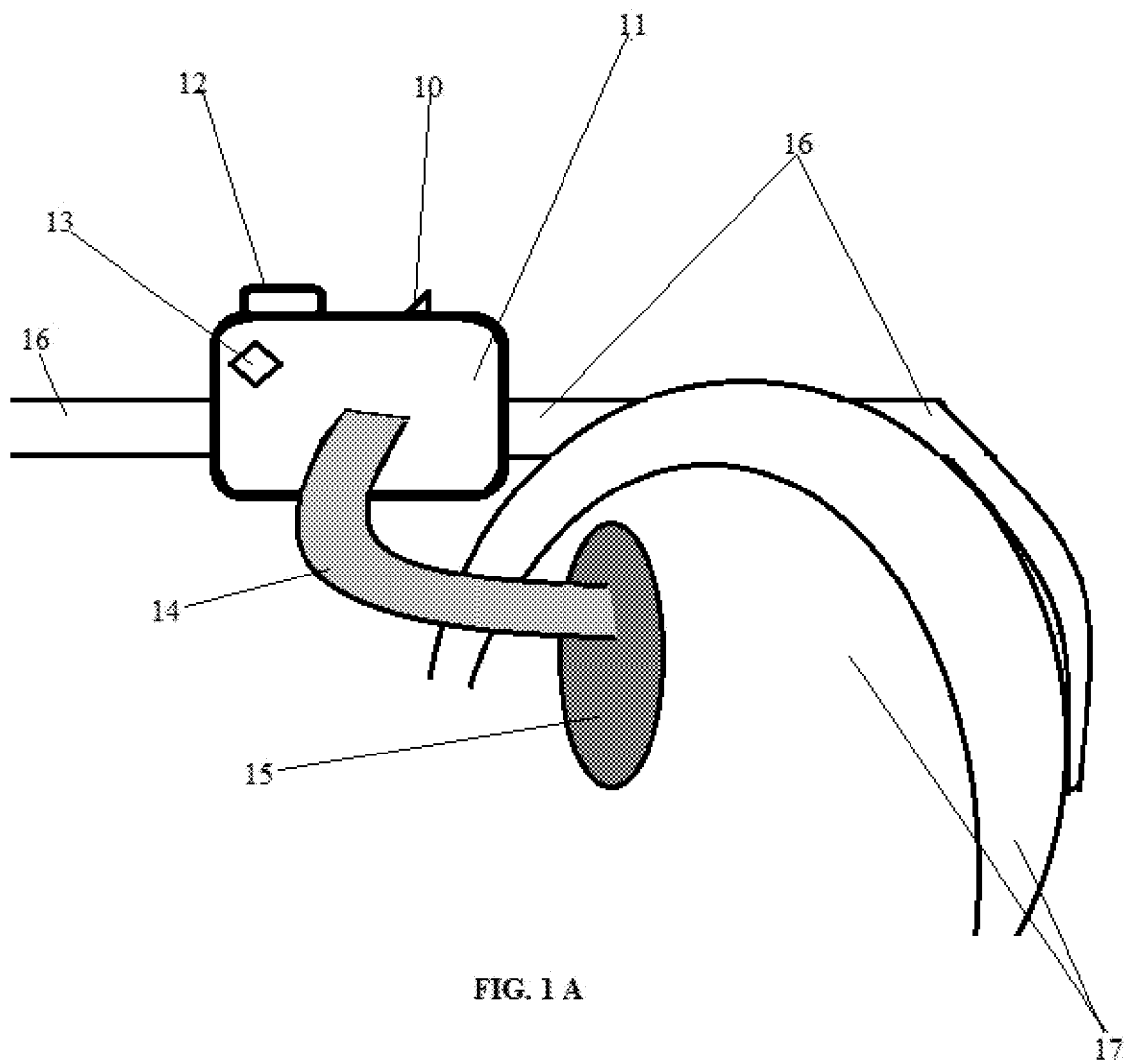
FIG. 1A shows a side view of an example of an eye glasses version of the noise cancelation device with adjustable speaker and record or save button.
FIG. 1B shows a front view of the eye glasses version of the noise cancelation device with adjustable speaker and record or save button.

Illustrated in FIG. 1A is a side view of one example of a noise cancelation device 11 that attaches to or is built in/on to either one or both eye glasses frame 16, for example to one or both of the temples or the earpieces of the frame 16. When the programmable noise cancelation device 11 is turned on using power switch 10, a person who wants to reduce or cancel unwanted noise, presses the record/save button 12, which engages the microphone 13 to listen and record all sounds received. While the record/save button 12 is pressed and held (or pressed and released, then pressed again to stop record/save feature), the sounds or noise and their respective sound waves are received through the microphone 13 are then saved into the programmable noise cancelation device 11. The sounds or noise and the respective sound waves that are programed or saved are then immediately inverted and broadcasted or emitted through the speaker 15 into and around the ear 17. When the person releases the record/save button 12 (or presses the record/save button 12 again), the noise cancelation device continues to broadcast the inverted sound waves through the speaker 15, thereby canceling, deadening, reducing the unwanted sounds/noise received while the record/save button 12 was activated. This would be advantageous for a person who wants to engage in a conversation and wants to cancel, deaden, reduce all other sounds, noise, and voices they do not want to hear. The speaker 15 is outside the ear 17 and its location may be adjusted by moving the speaker arm 14. The noise cancelation device 11 and all its components may vary in feature function, number, shape, size, function (e.g. button versus switch) and location, and the illustrations in FIG. 1A are for illustrative purposes only and the noise cancelation device is in no way limited to these examples.

Figure 1B:
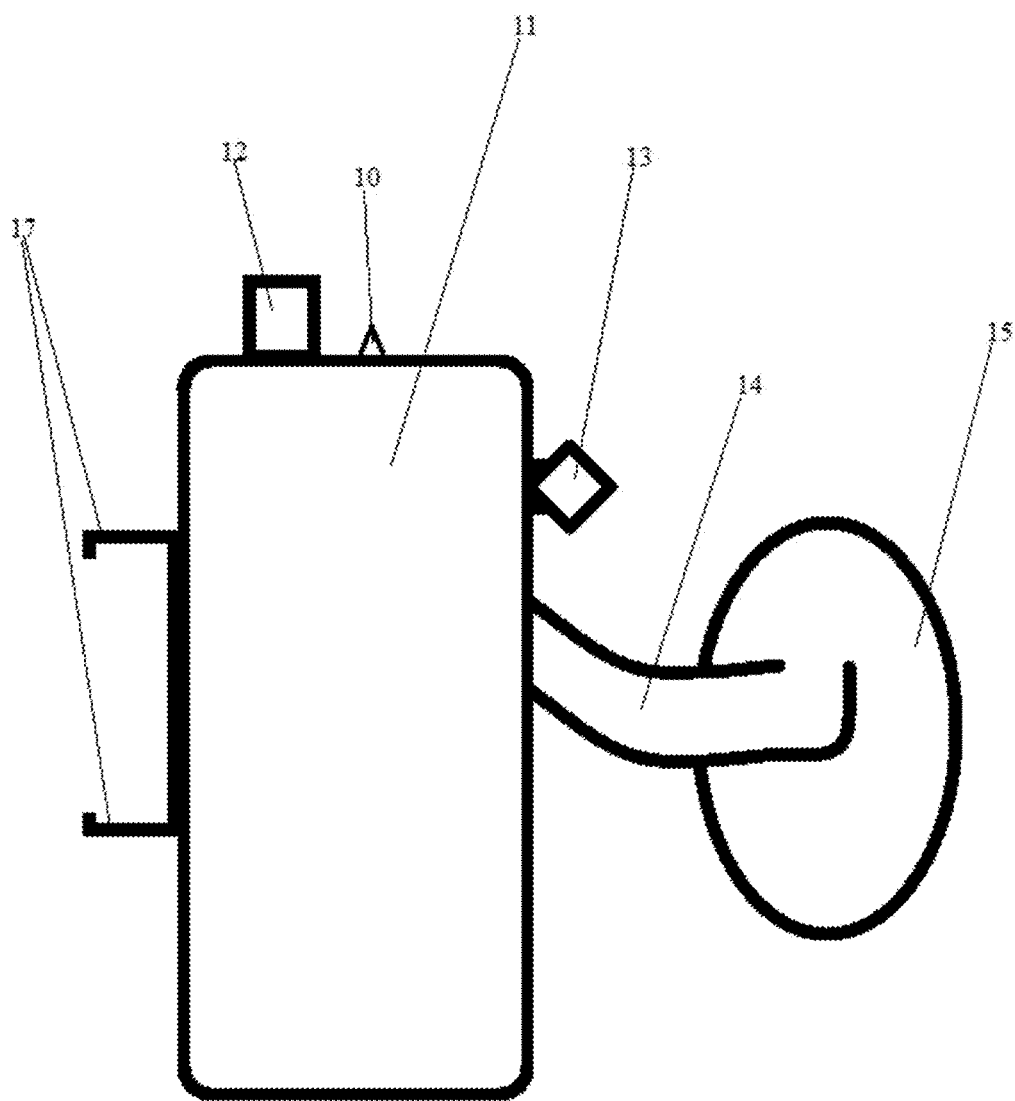

Illustrated in FIG. 1B is the front view of the noise cancelation device 11 shown in FIG. 1A. The noise cancelation device can be attached to eye glasses using the noise cancelation device's attachment mechanism 17 and attaching it to the temple(s) or ear piece(s) of a pair of eye glasses. Once the noise cancelation device is attached to the eye glasses, the speaker 15 position may be adjusted by moving the speaker arm 14. The noise cancelation device may be turned on using the power switch 10, and then to record and save unwanted sounds, noise, voices for cancelation, the user presses and holds (or presses once) the record/save button 12 to activate the record/save feature, which engages the noise cancelation device's microphone 13 allowing the noise cancelation device 11 to receive the sounds, noise, voices the user/person hears (but does not want to hear), inverts their respective sound waves and then broadcasts the inverted sound waves through the noise cancelation device speaker 15 into and around the person/user's ear, thereby canceling, deadening, or reducing the unwanted sound(s), noise, voice(s). When the user/person is finished recording/saving, the user/person releases the record/save button 12 (if held, or presses the record/save button 12 again) to end the recording/saving. The noise cancelation device 11 will continuously broadcast the inverted sound waves of the recorded/saved sounds, noise, voices through the noise cancelation device's speaker 15. When the user/person wants to shut off the noise cancelation device 11, the user/person switches the on/off button 10 to the off position. The programmable noise cancelation device 11 and all its components may vary in feature function, number, shape, size, function (button versus switch, as an example) and location, and the illustrations in FIG. 1B are for illustrative purposes only and the noise cancelation device is in no way limited to these examples.

Figure 2:
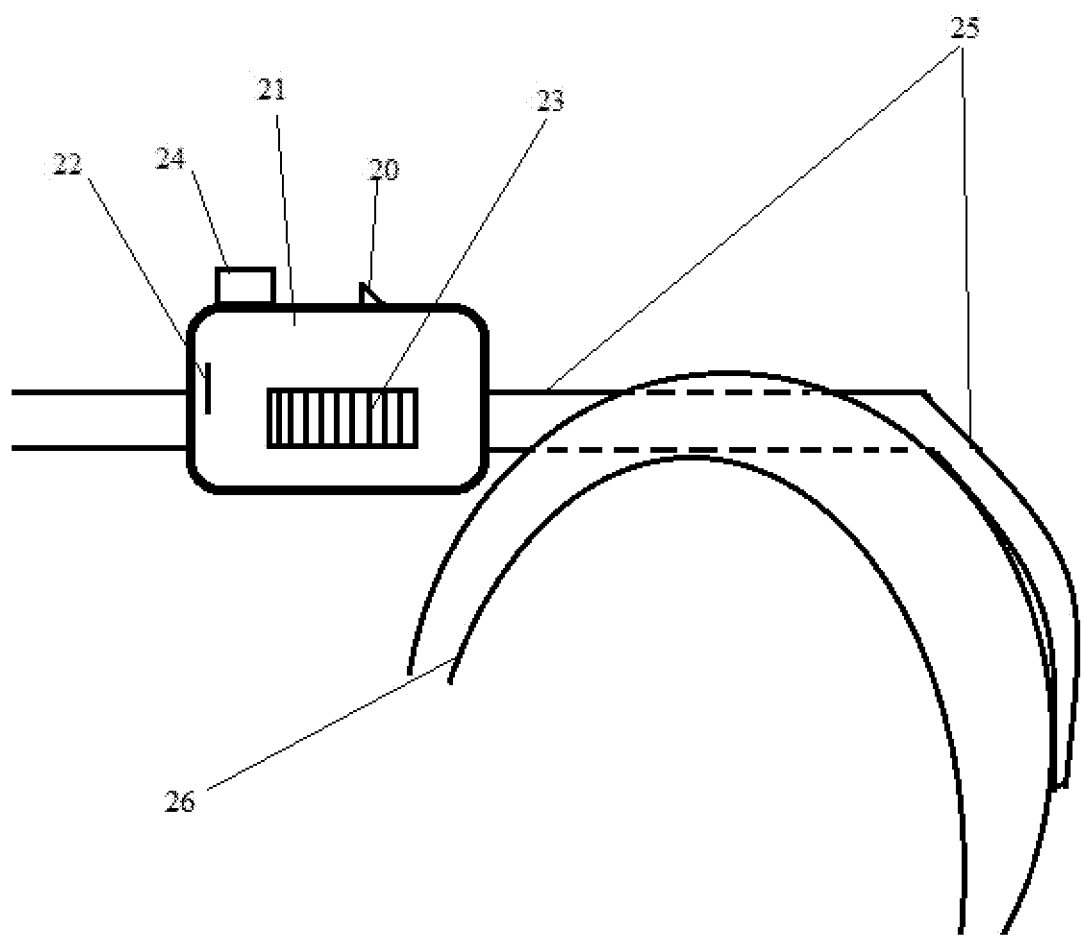
FIG. 2 shows a side view of another example of the eye glasses version of the noise cancelation device with built-in speaker.

Illustrated in FIG. 2 is a side view of another example of a programmable noise cancelation device 21 that attaches to or is built in/on to either one or both eye glasses frame 25, for example to one or both of the temples or the earpieces of the frame 25. When the programmable noise cancelation device 21 is turned on using the on/off switch 20, a person who wants to reduce or cancel unwanted noise, presses the record/save button 24, which engages the microphone 22 to listen and record all sounds received. The sounds and the respective sound waves that were received through the microphone 22 are then saved into the programmable noise cancelation device 21. The sounds and the respective sound waves that are saved are then immediately inverted and broadcasted or emitted through the speaker 23 into and around the ear 26. The speaker 23 may be a directional speaker or any audio speaker invented at the date of this writing or to be invented at a later date. The programmable noise cancelation device 21 and all its components may vary in feature function, number, shape, size, and location, and the illustrations in FIG. 2 are for illustrative purposes only and the noise cancelation device is in no way limited to these examples.

Figure 3A:
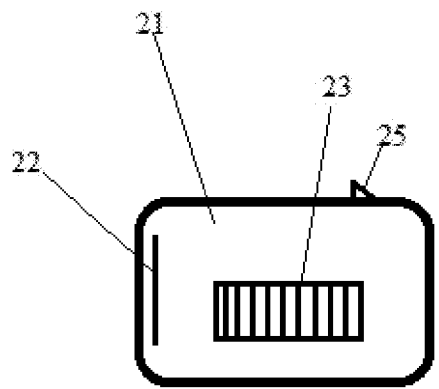
FIGS. 3A, 3B, 3C, 3D show side views of different examples of eye glasses versions of the noise cancelation device.
Figure 3B:
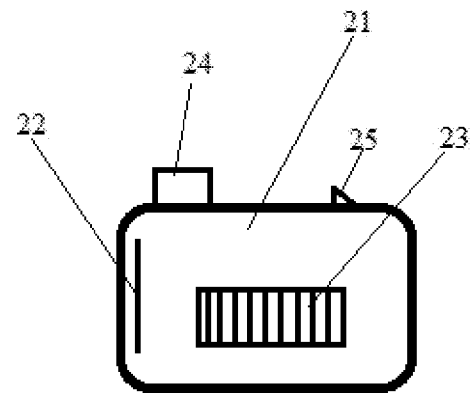

Illustrated in FIGS. 3A and 3B are side views of additional examples of the programmable noise cancelation device 21. The noise cancelation devices described herein may be attached to eye glasses frames, sunglasses frames, or any eyewear invented as of today or to be invented in the future. FIG. 3A shows the programmable noise cancelation device 21 with a microphone 22 and speaker 23. The programmable noise cancelation device 21 may be programmed using a remote control device 60 shown in FIG. 12A, remote control device 70 shown in FIG. 12B, or other remote control devices. The programmable noise cancelation device 21 may be attached by known attachment methods and attachment methods not yet invented. The programmable noise cancelation device 21 does not have to be attached to anything and may completely function unattached to anything. The programmable noise cancelation device 21 can be turned on and off by using the power mechanism 25. Once turned on, the programmable noise cancelation device 21 receives sounds, noise, voices through the microphone 22 and immediately inverts the corresponding sound waves and broadcasts the inverted sound waves through the speaker 23 into and around the person's ear(s) whom is wearing the programmable noise cancelation device 21. The broadcast of inverted sound waves through the speaker 23 cancels, deadens, reduces the original sounds received through the microphone 22. Illustrated in FIG. 3B is the programmable noise cancelation device 21 with the addition of the record/save mechanism 24. The record/save mechanism 24 allows a person to record sounds, noise, voices into the programmable noise cancelation device 21 by pressing the record/save mechanism 24 which immediately turns on the microphone 22 to receive sounds, noise, voices into the programmable noise cancelation device 21 and records/saves the received sounds, noise, voices until the record/save mechanism is pressed again, or released, which turns this feature off. The programmable noise cancelation device 21 has now saved the received sounds, noise, voices in the programmable noise cancelation device 21 and now inverts these sound waves and broadcasts the inverted sound waves through the speaker 23, thereby cancelling, deadening, reducing the originally received sounds, noise, voices. The speaker 23 broadcasts the inverted sound waves into and around the person's ear. The programmable noise cancelation device 21 shown in FIG. 3B can be operated from the remote control device(s) described herein. The programmable noise cancelation device 21 illustrated in FIGS. 3A and 3B may be powered by rechargeable battery(s), non-rechargeable battery(s), a remote or portable power source that may be connected to the programmable noise cancelation device 21, or other power sources. The noise cancelation devices and all its components may vary in feature function, number, shape, size, and location, and the illustrations in FIGS. 3A and 3B are for illustrative purposes only and the noise cancelation device is in no way limited to these examples.

Figure 3C:
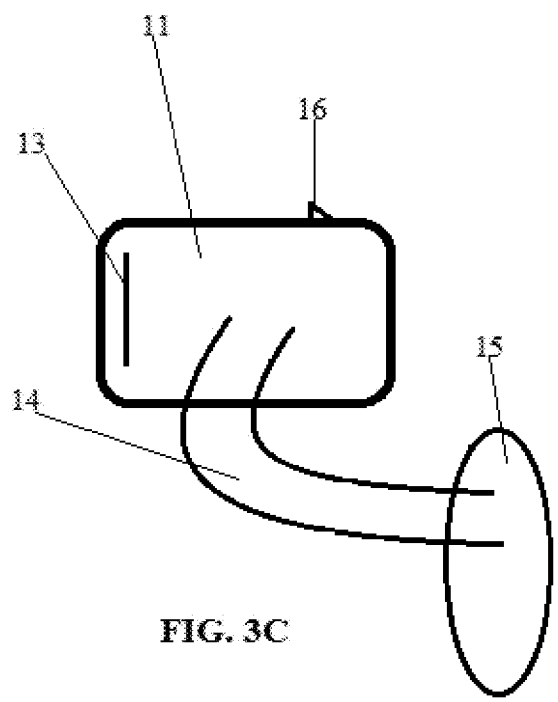
Figure 3D:
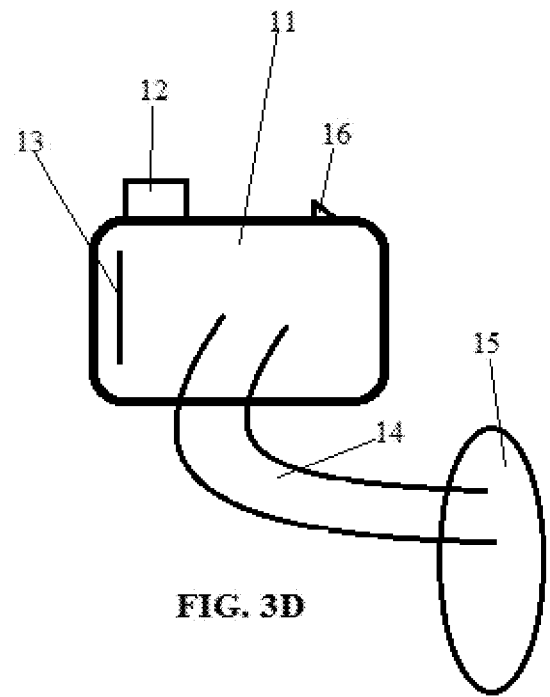

Illustrated in FIGS. 3C and 3D are side views of additional examples of the programmable noise cancelation device 11. The noise cancelation devices described herein may be attached to eye glasses frames, sunglasses frames, or any eyewear invented as of today or to be invented in the future, as well other objects or products. FIG. 3C shows the programmable noise cancelation device 11 with a power mechanism 16, a microphone 13, speaker arm 14, and speaker 15. The programmable noise cancelation device 11 may be programmed and/or operated using a remote control device 60 shown in FIG. 12A, remote control device 70 shown in FIG. 12B, or other remote control devices described or implied herein. The programmable noise cancelation device 11 may be attached by known attachment methods and attachment methods not yet invented. The programmable noise cancelation device 11 does not have to be attached to anything and may completely function unattached to anything. The programmable noise cancelation device 11 can be turned on and off by using the power mechanism 16. Once turned on, the programmable noise cancelation device 11 receives sounds, noise, voices through the microphone 13 and immediately inverts the corresponding sound waves and broadcasts the inverted sound waves through the speaker 15 into and around the person's ear(s) whom is wearing the programmable noise cancelation device 11. The speaker 15 is not inserted into a person's ear. The position of the speaker 15 may be adjusted by moving the speaker arm 14 until the speaker 15 is positioned as desired by the user. The broadcast of inverted sound waves through the speaker 15 cancels, deadens, reduces the original sounds received through the microphone 13. Illustrated in FIG. 3D is the programmable noise cancelation device 11 with the addition of the record/save mechanism 12. The record/save mechanism 12 allows a person to record sounds, noise, voices into the programmable noise cancelation device 11 by pressing the record/save mechanism 12 which immediately turns on the microphone 13 to receive sounds, noise, voices into the programmable noise cancelation device 11 and records/saves the received sounds, noise, voices until the record/save mechanism is pressed again, or released, which turns this feature off. The programmable noise cancelation device 11 has now saved the received sounds, noise, voices in the programmable noise cancelation device 11 and now inverts these sound waves and broadcasts the inverted sound waves through the speaker 15, thereby cancelling, deadening, reducing the originally received sounds, noise, voices. The speaker 15 broadcasts the inverted sound waves into and around the person's ear. The speaker 15 is not inserted into a person's ear. The programmable noise cancelation device 11 shown in FIG. 3D can be operated from the remote control device(s) described herein. The programmable noise cancelation device 11 illustrated in FIGS. 3C and 3D may be powered by rechargeable battery(s), non-rechargeable battery(s), a remote or portable power source that may be connected to the programmable noise cancelation device 11, or other power sources. The noise cancelation devices and all its components may vary in feature function, number, shape, size, and location, and the illustrations in FIGS. 3C and 3D are for illustrative purposes only and the noise cancelation device is in no way limited to these examples.

Illustrated in FIGS. 4A, 4B and 4C are front and back views of a portable foldable noise cancelation device 30. The portable foldable noise cancelation device 30 utilizes a microphone 31 that may be fixed, foldable, telescopic, or any other type of microphone invented or not invented yet. The microphone 31 may use directional microphone capabilities. Further illustrated in FIG. 4A is the on/off button 34 and the speaker volume control 37. When the portable foldable noise cancelation device is turned on, the microphone 31 receives/listens to the sounds, noise, voices and the portable foldable noise cancelation device 30 immediately inverts the received sounds, noise, voices to be broadcast through the speaker 33. FIG. 4B shows the microphone 31, the on/off button 34, the speaker volume control 37, the power on indicator light 36, and the speaker adjustment control 38. When the portable foldable noise cancelation device 30 is turned on, the power on indicator light 36 illuminates, and when the portable foldable noise cancelation device is turned off, the power on indicator light 36 will turn off. Further illustrated in FIG. 4B is the speaker volume control 37 and the speaker adjustment control 38. The speaker adjustment control 38 allows the user to adjust the broadcasting angle of the speaker 33, shown in FIG. 4C. Moving the speaker adjustment control 38 up and down controls the vertical angle of the inverted sound waves broadcasted through the speaker 33 of noise cancelation device 30. Moving the speaker volume control 37 adjust the volume of the broadcasted inverted sound waves. FIG. 4C shows the built-in speaker 33 which may broadcast the inverted sound waves of the original unwanted sounds or noise, thereby deadening, reducing, or canceling the unwanted sounds or noise. Further illustrated in in FIG. 4C is the power on indicator light 36, which illuminates when the portable foldable noise cancelation device 30 is turned on or powered on. When the portable foldable noise cancelation device 30 is turned off, the power on indicator light 36 will turn off. Further illustrated in FIG. 4C is the record/program button 35. When the noise cancelation device 30 is turned on, and when the record/program button 35 is pressed, the microphone 31 begins to receive or listen to and record the sounds in the area until the record/program button 35 is released. When the record/program button 35 is pressed and the portable foldable noise cancelation device 30 is recording/programming, the record indicator light 64 illuminates. When the portable foldable noise cancelation device 30 is no longer recording/programming the record/program indicator light 64 turns off. The portable foldable noise cancelation device 30 then inverts the recorded sound waves and emits or broadcasts the inverted sound waves through the speaker 33, thereby reducing, deadening, or canceling the recorded sounds, which were unwanted. The angle the speaker 33 broadcasts the inverted sound waves may be adjusted by moving the speaker adjustment control 38 up and down, thereby adjusting the angle of the broadcasted inverted sound waves up and down from the speaker 33. The portable foldable noise cancelation device 30 illustrated in FIGS. 4A, 4B, 4C may be powered by a rechargeable battery(s), a non-rechargeable battery(s), a combination of the aforementioned batteries, A/C or D/C power, or another source of power. Further illustrated in FIG. 4A the portable foldable noise cancelation device 30 may use a rechargeable battery that can be recharged using the port 59, and/or the USB port 61. The noise cancelation device 30 may also utilize A/C power in conjunction with a battery, rechargeable or non-rechargeable, and can plug into port 59 with a power cord. The portable foldable noise cancelation device 30 illustrated in FIGS. 4A, 4B, and 4C may be operated with the use of a remote control device 60 shown in FIG. 12A, remote control device 70 shown in FIG. 12B, or other remote control devices described herein or implied herein. The noise cancelation device 30 and all its components may vary in feature function, number, shape, size, and location, and the illustrations in FIGS. 4A, 4B, 4C are for illustrative purposes only and the noise cancelation device is in no way limited to these examples.

Illustrated in FIGS. 5A, 5B and 5C are front and back views of a portable foldable noise cancelation device 39. The portable foldable noise cancelation device 39 utilizes a microphone 32 that may be built-in to the noise cancelation device 39. The microphone 32 may utilize microphone technology currently invented or microphone technology not yet invented. Further, the microphone 32 may be a directional microphone. Further illustrated in FIG. 5A is the on/off button 34, and the speaker volume control 37. The portable foldable noise cancelation device 39 shown in FIG. 5A can be used for active noise cancelation. When the portable foldable noise cancelation device 39 is turned on, the microphone 32 and speaker 33, shown in FIG. 5C, are automatically activated; the microphone 32 receives sounds into the portable foldable noise cancelation device 39, which immediately inverts the sound waves and broadcasts the inverted sound waves through the speaker 33, thereby canceling, deadening, reducing the original sounds as active noise cancelation. When there are specific sounds a user wants to cancel, deaden, reduce, the user utilizes the record/program function of the portable foldable noise cancelation device 39. Further illustrated in FIG. 5A the portable foldable noise cancelation device 39 may use a rechargeable battery that can be recharged using the recharge port 59, and/or the USB port 61. The noise cancelation device 39 may also utilize A/C power in conjunction with a battery, rechargeable or non-rechargeable, and can plug into port 59 with a power cord. FIG. 5B shows the on/off button 34, the microphone 32, and the speaker volume control 37. Further shown in FIG. 5B is the power on indicator light 36 and the speaker adjustment control 38. When the portable foldable noise cancelation device 39 in turned on or powered on, the power on indicator light 36 illuminates. When the portable foldable noise cancelation device 39 is turned off, the power on indicator light 36 will turn off. FIG. 5B shows the speaker adjustment control 38, which controls the angle of the broadcasted inverted sounds waves through the speaker 33, shown in FIG. 5C. Moving the speaker adjustment control 38 up and down adjusts the angle in which the speaker 33 broadcasts the inverted sound waves. The volume of the broadcasted inverted sound waves can be adjustment using the speaker volume control 37. The microphone 32 receives sounds, noise, voices into the portable foldable noise cancelation device 39, which inverts the received sound waves and broadcasts the inverted sound waves through the speaker 33, thereby canceling, deadening, reducing the original sounds. The portable foldable noise cancelation device 39 shown in FIGS. 5A, 5B, 5C can be used for active noise cancelation. When the portable foldable noise cancelation device 39 is turned on, the microphone 32 and speaker 33 are automatically activated, the microphone 32 receives sounds into the portable foldable noise cancelation device 39, which immediately inverts the sound waves and broadcasts the inverted sound waves through the speaker 33, thereby canceling, deadening, reducing the original sounds as active noise cancelation. When there are specific sounds a user wants to cancel, deaden, reduce, the user utilizes the record/program function of the portable foldable noise cancelation device 39. FIG. 5C shows the built-in speaker 33 which may broadcast the inverted sound waves of the original unwanted sounds or noise, thereby deadening, reducing, or canceling the unwanted sounds or noise. Further illustrated in the FIG. 5C is the power on indicator light 36, the record/program button 35 and the recording indicator light 64. When the noise cancelation device 39 is turned on, the power on indicator light 36 illuminates, and when the record/program button 35 is pressed, the recording indicator light 64 illuminates and the microphone 32 shown in FIGS. 5A and 5B begins to receive/listen to and record the sounds in the area until the record/program button 35 is released, or pressed again to turn off the record feature, and when the record feature is turned off, the recording indicator light turns off. When the record feature is turned on, the portable foldable noise cancelation device 39 then inverts the recorded sound waves and emits or broadcasts the inverted sound waves through the speaker 33, thereby reducing, deadening, or canceling the recorded sounds, which were unwanted. FIG. 5D shows the inside panel of portable foldable noise cancelation device 39 and an example of the battery compartment 67. The battery compartment can house a rechargeable battery(s), a non-rechargeable battery(s), a combination of the aforementioned batteries, or another source of power. The portable foldable noise cancelation device 39 illustrated in FIGS. 5A, 5B, 5C may be powered by a rechargeable battery(s), a non-rechargeable battery(s), a combination of the aforementioned batteries, A/C or D/C power, or another source of power. The portable foldable noise cancelation device 39 illustrated in FIGS. 5A, 5B and 5C may be operated with the use of a remote control device 60 shown in FIG. 12A, remote control device 70 shown in FIG. 12B, or other remote control devices described or implied herein. The noise cancelation device 39 and all its components may vary in feature function, number, shape, size, and location, and the illustrations in FIGS. 5A, 5B, 5C, and 5D are for illustrative purposes only and the noise cancelation device is in no way limited to these examples.

Illustrated in FIGS. 6A, 6B, 6C, 6D, 6E and 6F are the back, side, and front views of an attachable noise cancelation device 40 that can be attached to a desired support. FIG. 6A shows the back view of the attachable noise cancelation device 40, revealing a microphone 41, and an attachment mechanism 42, such as hook and loop fastener like VELCRO™, as an example of one method of attaching the noise cancelation device 40 to another surface, object, or wherever a person would like to attach it. Illustrated in FIG. 6B is a side view of the attachable noise cancelation device 40 revealing a speaker volume control 45, and an on/off button 43. FIG. 6C is a front view of the attachable noise cancelation device 40. Shown in FIG. 6C is the power on indicator light 36, the record/program button 46, the recording indicator light 64, and the speaker 47. The speaker 47 broadcasts or emits the inverted sound waves of the unwanted sound(s) or noise either live or recorded/programmed into the attachable noise cancelation device 40 via the microphone 41 and by pressing the record/save/program button 46, the use of which has been mentioned in previous paragraphs. The attachable noise cancelation device 40 can be used as active noise cancelation by turning it on, which immediately activates the microphone 41, that receives sounds, noise, voices into the attachable noise cancelation device 40, which immediately inverts the received sound waves and broadcasts the inverted sound waves through the speaker 47. FIG. 6D is a side view of the other side of attachable noise cancelation device 40. Shown in FIG. 6D is a Universal Serial Bus (USB) port 61 that can be used to charge a rechargeable battery(s), to update software in the attachable noise cancelation device 40, and/or to provide power to the attachable noise cancelation device 40. Further illustrated in FIG. 6D is a battery recharge port 59 or port 59 can be used as an A/C power connector. FIG. 6E shows the back side of attachable noise cancelation device 40, revealing previously mentioned attachment 42, alternative locations for the aforementioned USB 61 and port 59, and examples of possible locations for battery compartment(s) 67, which may house rechargeable and non-rechargeable batteries. FIG. 6F shows a side view of attachable noise cancelation device 40, revealing another example of a location for battery compartment 67, and also port 59. The noise cancelation device 40 and all its components may vary in feature function, number, shape, size, and location, and the illustrations in FIGS. 6A, 6B, 6C, 6D, 6E, 6F are for illustrative purposes only and the noise cancelation device is in no way limited to these examples.

FIGS. 7A, 7B, 7C illustrate back, side, and front views, respectfully of a variation of the attachable noise cancelation device 40. FIGS. 7A and 7B show the noise cancelation device 40 as including a clip attachment mechanism 44. The attachable noise cancelation device 40 in FIGS. 7A, 7B and 7C is otherwise similar to the noise cancelation device in FIGS. 6A, 6B and 6C. The clip attachment mechanism 44 is one example of many attachment mechanisms that may be used with the noise cancelation device(s) described herein and in no way limits the present invention to the aforementioned examples or to-be mentioned examples. Further, the location, size, number, and shape of the noise cancelation device and its feature(s) function, accessories, nobs, buttons, and controls are examples only and can vary.

FIG. 8A is a side view of the portable programmable noise cancelation device 50. Shown in FIG. 8A is the main control side of the portable programmable noise cancelation device 50. All other sides can have the same features, a modified number of these features, different features or other features not shown, or any combination of features as illustrated in FIG. 8A. The example shown is a rechargeable noise cancelation device and the battery may be recharged by plugging a power charging cord into plug 59, or by connecting to the Universal Serial Bus (USB) port 61 with the necessary USB cable. The battery(s) indicator light 48 will illuminate red when the battery(s) needs to be charged, orange when the battery(s) is recharging, and green when the battery(s) is fully charged. The portable programmable noise cancelation device 50 may be non-rechargeable battery powered and or A/C powered, with A/C power cord plugged into port 59. If the portable programmable noise cancelation device 50 is powered by non-rechargeable battery(s), the battery(s) indicator light 48 will illuminate green when battery strength is good, orange when battery strength is low, and red when battery strength is critically low. The noise cancelation device 50 may be powered via the USB port. To activate the portable programmable noise cancelation device 50 a person uses the on/off control 56. Once the portable programmable noise cancelation device 50 is turned on, a person may extend the telescopic microphone support 53 to a desired height, positioning the microphone 51 to the desired height. The portable programmable noise cancelation device 50 has the capability of canceling noise in real-time, or may utilize the programmable feature. To use the real-time noise cancelation, a person turns the active cancelation control 91 to the "on" position, illuminating the active noise cancelation indicator light 69, and immediately turns the microphone 51 on. The microphone can be turned on and off manually by using the microphone on/off control 54. The microphone 51 may be a directional microphone or any type of microphone invented or not yet invented, and may be stationary or rotational along its horizontal axis. When unwanted sounds are received by the microphone 51, the sound waves of the unwanted sounds enter the portable programmable noise cancelation device 50 and the sound waves are immediately inverted and then broadcast out through the speakers 52. The speakers 52 may be directional speakers or any speaker invented or not yet invented. The angle of the broadcasted inverted sound waves from the speakers 52 can be raised and lowered to a desired angle by moving the directional speaker angle control 58 up and down, which would maximize the cancelation of unwanted sounds or noise by broadcasting the inverted sound waves from the speakers 52 to the person(s) the speakers are directed toward. The breadth of the inverted sound waves broadcasted from the speaker 52 can be widened or narrowed by moving the speaker breadth control 49 left and right, allowing for a wider or narrower breadth of the broadcasted inverted sound waves from the speakers 52. The volume of the broadcasted inverted sound waves through speakers 52 may be adjusted by the volume control 57, by turning it clockwise and counterclockwise. The volume control can vary and the volume control 57 is an example of one control. All control mechanisms and features can vary and are not limited to the examples given and illustrated in FIG. 8A. Further illustrated in FIG. 8A is the ability to program, record, or save unwanted sounds or noise by using the record/program control 55. When the portable programmable noise cancelation device 50 is turned on the power indicator light 36 will illuminate, and when the microphone 51 is adjusted to the desired height by moving the microphone support 53 up and down, or it can adjusted at any time, a person may turn on the record/program control 55 which will begin to record, save, and program the unwanted sounds and noise received through the microphone 51 into the portable programmable noise cancelation device 50. When the record/program/save control 55 is turned on, the indicator light 64 will illuminate. The person then turns off the record/program control 55 to stop the record, save, program function, and the indicator light 64 will turn off. The recorded/programmed sounds and noise that are now stored in the portable programmable noise cancelation device 50 are immediately inverted and broadcast out through the speakers 52, thereby reducing, deadening, or canceling the unwanted sounds and noise, the same that had been programmed or recorded earlier. To add to the ability to cancel unwanted sounds and noise, the angle in which the speakers 52 broadcasts the inverted sound waves may be adjusted by using the speaker angle control 58, as well as the volume level of the inverted sounds waves by using the volume control 57, thereby maximizing unwanted sound and noise reduction or cancelation. The speaker angle control 58, the speaker breadth control 49, the volume control 57, and all other features shown on the main control panel 18 of portable programmable noise cancelation device 50 relate directly with the speaker 52 facing the same side as the control panel 18, allowing customized noise cancelation for the user(s) of the main control panel 18 and customized noise cancelation for the user(s) of the other sides, control panels of portable programmable noise cancelation device 50, thereby allowing each user(s) to control their specific sides of the portable programmable noise cancelation device 50 and noise cancelation thereof. The portable programmable noise cancelation device 50 can cancel noise, sound, voices in real-time by turning on the active noise cancelation control 91. When the active noise cancelation control 91 is turned on, the microphone 51 is immediately activated/turned on and all sounds, noise, voices received through the microphone 51 into the portable programmable noise cancelation device 50 are instantly inverted, that is the sound waves associated with the sounds received through microphone 51 are instantly inverted and broadcasted through speaker 52, thereby canceling, deadening, reducing the original sounds in area of the broadcasted inverted sound waves from speaker 52. The indicator lights shown in FIG. 8A illuminate and turn off as their corresponding control/feature is turned on and off. FIG. 8A is an example of one possible version of the portable programmable noise cancelation device 50 that uses a rechargeable battery that can be recharged using the recharge port 59, and/or the USB port 61. The portable programmable noise cancelation device 50 may also utilize A/C power in conjunction with a battery, rechargeable or non-rechargeable. The control panel 18 on portable programmable noise cancelation device 50 can be digital or combination of digital, analog, and other mechanical control mechanisms. All features and controls of portable programmable noise cancelation device 50 can be activated and utilized with the remote control device 60 shown in FIG. 12A and remote control device 70 shown in FIG. 12B, or another remote control device described or implied herein. FIG. 8A is an example of one possible version of the portable programmable noise cancelation device 50, and the noise cancelation device is in no way limited to the examples illustrated in FIG. 8A and discussed in this or any paragraph. The portable programmable noise cancelation device 50 and all its components, microphones, and speakers may vary in feature function, number, shape, size, location, and the illustrations in FIG. 8A are for illustrative purposes only and the noise cancelation device is in no way limited to these examples.

FIG. 8B is the same as the portable programmable noise cancelation device 50 shown in FIG. 8A except with the added features and controls of allow only 89, save as 88, and recall 90. Illustrated in FIG. 8B is the portable programmable noise cancelation device 50 the save as 88 control that allows a user to save sound, noise, voice into the portable programmable noise cancelation device 50 memory. The recall control 90 allows the user to recall a saved sound, noise, voice from the portable programmable noise cancelation device 50 memory and broadcast the inverted sound waves of the recalled sound, noise, voice through the speaker 52 thereby canceling, deadening, reducing the recalled sound, noise, voice. As an example, this feature may be used when situated in an environment that has the same sounds, noise, voice(s) on a continual basis, or at different times. The allow only control 89 of the portable programmable noise cancelation device 50 allows a user to recall a saved voice, as an example, from the portable programmable noise cancelation device 50 memory to be heard while the portable programmable noise cancelation device 50 actively cancels all other sounds, noise, voices received through the microphone 51 into the portable programmable noise cancelation device 50, the sound waves received are instantly inverted and immediately the inverted sound waves are broadcast through the speaker 52. This cancels, deadens, reduces all other sounds, noises, voices broadcast through the portable programmable noise cancelation device 50 speaker 52 except for the allowed only voice, thereby making a conversation possible in a noisy environment. This is an example only and does not limit the capabilities and uses of the portable programmable noise cancelation device 50 to this example or other examples herein. The control panel 18 on portable programmable noise cancelation device 50 can be digital or combination of digital, analog, and other mechanical control mechanisms. All features and controls of portable programmable noise cancelation device 50 can be activated and utilized with the remote control device 60 shown in FIG. 12A and remote control device 70 shown in FIG. 12B, or another remote control device described or implied herein. FIG. 8B is an example of one possible version of the portable programmable noise cancelation device 50, and the noise cancelation device is in no way limited to the examples illustrated in FIG. 8B and discussed in this or any paragraph. The portable programmable noise cancelation device 50 and all its components, microphones, and speakers may vary in feature function, number, shape, size, location, and the illustrations in FIG. 8B are for illustrative purposes only and the noise cancelation device is in no way limited to these examples.

FIG. 9A is a side view of the portable programmable noise cancelation device 50. Shown in FIG. 9A is another side of the portable programmable noise cancelation device 50 revealing control panel 19. Control panel 19 is similar to the main control panel 18 shown in FIG. 8A, with a few exceptions. All other sides of the portable programmable noise cancelation device 50 can have the same features, a modified number of these features, different features not shown, or any combination of features as illustrated in FIG. 9A. All other sides of the portable programmable noise cancelation device 50 can have the same control panel 19 as illustrated in FIG. 9A, a modified control panel, different control panel not shown, or any combination therein. To activate the portable programmable noise cancelation device 50 shown in FIG. 9A, a person uses the on/off control 56 shown in FIG. 8A. Once the portable programmable noise cancelation device 50 is turned on, a person can operate the portable programmable noise cancelation device 50 as described in detail in the paragraph of FIG. 8A. The control panel 19 on portable programmable noise cancelation device 50 can be digital, analog, mechanical, or any combination therein. All features and controls of portable programmable noise cancelation device 50 can be activated and utilized with the remote control device 60 shown in FIG. 12A and remote control device 70 shown in FIG. 12B, or another remote control device described or implied herein. FIG. 9A is an example of one possible version of the portable programmable noise cancelation device 50, and the noise cancelation device is in no way limited to the examples illustrated in FIG. 9A and discussed in this or any paragraph. The noise cancelation device 50 and all its components, microphones, and speakers may vary in feature function, number, shape, size, location, and the illustrations in FIG. 9A are for illustrative purposes only and the noise cancelation device is in no way limited to these examples.

FIG. 9B is the same as the portable programmable noise cancelation device 50 shown in FIG. 9A except with the added features and controls of allow only 89, save as 88, and recall 90. Illustrated in FIG. 9B is the portable programmable noise cancelation device 50 the save as 88 control that allows a user to save sound, noise, voice into the portable programmable noise cancelation device 50 memory. The recall control 90 allows the user to recall a saved sound, noise, voice from the portable programmable noise cancelation device 50 memory and broadcast the inverted sound waves of the recalled sound, noise, voice through the speaker 52 thereby canceling, deadening, reducing the recalled sound, noise, voice. As an example, this feature may be used when situated in an environment that has the same sounds, noise, voice(s) on a continual basis, or at different times. The allow only control 89 of the portable programmable noise cancelation device 50 allows a user to recall a saved voice, as an example, from the portable programmable noise cancelation device 50 memory to be heard while the portable programmable noise cancelation device 50 actively cancels all other sounds, noise, voices received through the microphone 51 into the portable programmable noise cancelation device 50, the sound waves received are instantly inverted and immediately the inverted sound waves are broadcast through the speaker 52. This cancels, deadens, reduces all other sounds, noises, voices broadcast through the portable programmable noise cancelation device 50 speaker 52 except for the allowed only voice, thereby making a conversation possible in a noisy environment. This is an example only and does not limit the capabilities and uses of the portable programmable noise cancelation device 50 to this example or other examples herein. The control panel 18 on portable programmable noise cancelation device 50 can be digital or combination of digital, analog, and other mechanical control mechanisms. All features and controls of portable programmable noise cancelation device 50 can be activated and utilized with the remote control device 60 shown in FIG. 12A and remote control device 70 shown in FIG. 12B, or another remote control device described or implied herein. FIG. 9B is an example of one possible version of the portable programmable noise cancelation device 50, and the noise cancelation device is in no way limited to the examples illustrated in FIG. 9B and discussed in this or any paragraph. The portable programmable noise cancelation device 50 and all its components, microphones, and speakers may vary in feature function, number, shape, size, location, and the illustrations in FIG. 9B are for illustrative purposes only and the noise cancelation device is in no way limited to these examples.

FIG. 10 is a top view or overhead view of a portable programmable noise cancelation device 50 of FIG. 8A, FIG. 8B, FIG. 9A and FIG. 9B, that includes one or more telescopic microphones 51 as well as directional speakers 52. The feature function, shape, size, location, number of, and kind of microphones 51 and speakers 52 may vary and are not limited to the examples illustrated in FIG. 10.

FIGS. 11A and 11B illustrate an example of turning the power of the noise cancelation device on and off. Shown in FIG. 11A is the wall switch 70 with the wall switch lever 71 in the "off" position. FIG. 11B shows the wall switch 70 with the wall switch lever 71 in the "on" position.

FIG. 12A is an overhead or top view of an example of the remote control device 60 that can be used to operate the noise cancelation device and features of the noise cancelation device. To turn on the remote control device 60, a person presses the power button 61 and a green light 62 illuminates to indicate the remote control device 60 is on and operational. To turn off the remote control device 60 a person presses the power button 61 again and the green light will go off to indicate the remote control device 60 is shut off. The remote control device 60 may be used to operate the noise cancelation devices described herein to program, save, and record unwanted sounds and noise by pressing the record/program button 63, which activates the microphones of the noise cancelation device, which records, saves or programs the sounds and noises received by the microphone. There is a red indicator light 64 that illuminates to indicate when the noise cancelation device is recording, saving, or programming sounds through the microphone(s). The remote control device 60 further allows the volume control 66 to control the volume of the speaker of the noise cancelation device. The remote control device 60 allows for the control of the direction of the noise cancelation device's speakers' broadcast of the inverted sound waves of the unwanted noise or sounds, thereby reducing, deadening, or canceling the unwanted sounds or noise, by using the speaker directional control 65. This may be done using the speaker control 65 and the speaker control button 66 on the remote control device 60. FIG. 12A illustrates just one example of the remote control device 60 and does not limit the remote control device 60 to the illustrated example with regard to size, shape, controls, accessories, features, etc. as well as uses or any other limitations.

FIG. 12B is an overhead or top view of an example of the remote control device 70 that can be used to operate the noise cancelation device and features of the noise cancelation device. To turn on the remote control device 70, a person presses the power button 71 and a green light 86 illuminates to indicate the remote control device 70 is powered on and operational. To turn off the remote control device 70 a person presses the power button 71 again and the green light will go off to indicate the remote control device 70 is shut off. The remote control device 70 can turn the power on and off of the noise cancelation device by pressing the noise cancelation power button 79 on the remote control device 70. When the noise cancelation device is powered on, the green indicator light 80 will illuminate green. When the noise cancelation deice is turned on, it may be turned off by pressing the noise cancelation power button 79 on the remote control device 70. The remote control device 70 may be used to operate the noise cancelation devices described herein to record, save, program, store, and recall saved unwanted sounds and noise by pressing the record/program button 76, which activates the microphones of the noise cancelation device, which records, saves, stores, or programs the sounds and noises received by the microphone, into the noise cancelation device. The remote control device 70 has the ability to create a file name to save the recorded sounds, noises, voices into the noise cancelation device by pressing the "save as" button 74 which opens a blank field to type a file name using the keyboard 72 to identify the saved file, then pressing the "enter" button on the keyboard 72 to save the file into the noise cancelation device's memory. To turn the noise cancelation device on and off by using the remote control device 70, a person presses the noise cancelation device power control button 79 on the remote control device 70. There is an indicator light 80 that will illuminate green when the noise cancelation device, that is associated with the remote control device 70, is turned on. When the indicator light 80 is not green, this indicates that the noise cancelation device is turned off, and not connected or not communicating with the remote control device 70. Of course all indicator lights, features, and controls will be turned off and unable to be used if the remote control device 70 is not turned on. The remote control device 70 can be used to recall previously saved noises, sounds, voices stored in the memory of the noise cancelation device by pressing the recall window/button 82 or pressing the drop-down indicator button 83, which will reveal the saved file names in the recall window 82. A person may also press the recall window/button 82 and then using the keyboard 72 type the saved file's name in the window 82, and press the enter key on the keyboard 72 to recall and activate the saved sound(s), noise(s), voice(s), which the noise cancelation device then broadcasts the inverted sound waves through its speakers. A person may choose to record a sound, noise, voice on the noise cancelation device by pressing the record button 76 on the remote control device 70, thereby activating the record feature of the noise cancelation device to record the sound, noise, voice. When the record button 76 on the remote control 70 is either released or pressed again (depending on the how the feature is setup), the record feature of the noise cancelation device is turned off or stopped. The remote control device 70 can be used to activate the microphone(s) of the noise cancelation device by pressing the microphone button 78 on the remote control 70 to turn on the microphone(s) of the noise cancelation device. When the microphone of the noise cancelation device is turned on, the microphone indicator light 77, on the remote control device 70, is illuminated green. The remote control device 70 can turn off the microphone(s) of the noise cancelation device by pressing the microphone button 78 again. When the microphone the microphone of the noise cancelation device is turned off, the indicator light 77 will turn off and not be illuminated green. The remote control device 70 can be used to turn on the active noise cancelation feature of the noise cancelation device by pressing the active noise cancelation control 81 on the remote control device 70, thereby turning on the active noise cancelation feature on the noise cancelation device, which can be indicated by the illumination of active noise cancelation indicator light 87 on the remote control device 70. To turn off the active noise cancelation feature on the noise cancelation device a person can press the active noise cancelation control 81 on the remote control device 70 again and active noise cancelation is turned off on the noise cancelation device, and indicated on the remote control device 70 when the active noise cancelation indicator 87 is no longer illuminated. The remote control device 70 can be used to control the volume and direction adjustment of the speaker(s) of the noise cancelation device by moving the volume control 84 and the speaker direction adjustment control 85 on the remote control device 70. The volume control 84 adjusts the volume of the noise cancelation device by moving the volume control 84 left and right on the remote control device 70. To control the direction of the speaker(s) of the noise cancelation device, the speaker direction adjustment control 85 up and down on the remote control device 70. The remote control device 70 has features and control mechanisms and methods of utilization that have been expressed as buttons to activate and deactivate controls in this paragraph and other paragraphs herein and they are only examples of one method of operation to use the controls and features, and the remote control devices used with noise cancelation devices herein are not limited to only these examples. Buttons may be used, switches may be used, touch-screens may be used, and all other mechanisms or methods of utilization may be used on the remote control device 70, remote control device 60, or other remote control devices that may be associated with the noise cancelation device and not used as examples herein. Therefore the power control 71, noise cancelation device record control 76, noise cancelation device microphone control 78, noise cancelation device power control 79, noise cancelation device active noise cancelation control 81, noise cancelation device speaker volume control 84, noise cancelation device speaker directional control 85 and other features of the remote control device 70 can be buttons, slide mechanisms, switches, touchscreens, and all other methods available.

Illustrated in FIGS. 13A and 13B are top views or overhead views of the portable flip-open noise cancelation device 100. The portable flip-open noise cancelation device 100 shown in FIGS. 13A and 13B are examples of possible configurations of the noise cancelation device and are examples only and the portable flip-open noise cancelation device 100 is not limited to the examples shown in FIGS. 13A and 13B or described herein. Configurations, features, functions, shapes and sizes of the portable flip-open noise cancelation device 100 can vary. The portable flip-open noise cancelation device 100 can be activated or turned on using the power control button 101. When the portable flip-open noise cancelation device 100 is turned on, the power indicator light 102 illuminates to show the portable flip-open noise cancelation device 100 is turned on. When the portable flip-open noise cancelation device 100 is turned on, the microphone 103 receives sounds, noise, voices into the portable flip-open noise cancelation device 100 and the portable flip-open noise cancelation device 100 instantly inverts the corresponding sound waves received through the microphone 103 and immediately broadcasts the inverted sound waves through the speaker 104, thereby canceling, deadening, reduces the original sounds received through the microphone 103. The speaker volume control 105 can be used to increase or decrease the inverted sound waves broadcasting through the speaker 105, giving the user more control to better cancel, deaden, reduce the unwanted sounds, noise, voices. The portable flip-open noise cancelation device 100 can open and close using the hinges 106, which attach the two sides of the portable flip-open noise cancelation device 100. As one example of use, a person is in a hotel room and there is loud unwanted noise coming from the closed window. The portable flip-open noise cancelation device 100 can be placed over the back of a chair, with the microphone 103 of the portable flip-open noise cancelation device 100 on one side of the chair facing the source of the sounds, noise, voices to be canceled, deadened, reduced, and the speaker 104 of the portable flip-open noise cancelation device 100 on the other side of the back of the chair facing the person/user. The person can then lay down on a bed and with the portable flip-open noise cancelation device 100 between the user and the window, the portable flip-open noise cancelation device 100 cancels, deadens, reduces the unwanted noise coming from the window and the person can rest in quiet. All features and controls of portable programmable noise cancelation device 100 can be activated, controlled, and utilized with the remote control device 60 shown in FIG. 12A and remote control device 70 shown in FIG. 12B, or another remote control device described or implied herein.

FIG. 14 is an illustration of a Slip Joint Hinge, or sometimes referred to as a Take Apart Hinge. This hinge is used for easy and quick separation of two parts connected by this hinge. The hinge works as a normal hinge. This hinge is comprised of a male leaf with an attachable pin and a female leaf with no pin.

Illustrated in FIGS. 15A and 15B is the noise cancelation device utilizing the Slip Joint Hinge shown in FIG. 14. FIG. 15A shows a side view of the noise cancelation device 107 with a slip joint hinge 110, the microphone side 108 of the noise cancelation device 107, and the speaker side 109 of the noise cancelation device 107. FIG. 15B shows the noise cancelation device 107 with the slip joint hinge 110 separated, allowing the microphone side 108 of the noise cancelation device 107 to be placed in one location and the speaker side 109 of the noise cancelation device 107 to be place in another location. As an example, the portable flip-open noise cancelation device can use a slip joint hinge as previously shown, or the portable flip-open noise cancelation device can use the slip joint hinge to separate the microphone side and the speaker side of the portable flip-open noise cancelation device to place the microphone side in one location and the speaker side in another location, thereby allowing more flexibility and better noise cancelation. The two sides, when separated, communicate via wireless technology, with the microphone 108 receiving the sounds, noise, voices into the noise cancelation device 107 and the noise cancelation device 107 instantly inverts the sound waves and immediately broadcasts the inverted sound waves through the speaker 109, thereby canceling, deadening, reducing the original sounds, noise, voices received through the speaker 108. FIGS. 15A, 15B are examples of one possible version of the portable programmable noise cancelation device, and the noise cancelation device is in no way limited to the examples illustrated in FIGS. 15A, 15B and discussed in this or any paragraph. The portable programmable noise cancelation device and all its components, microphones, and speakers may vary in feature function, number, shape, size, location, and the illustrations in FIGS. 15A, 15B are for illustrative purposes only and the noise cancelation device is in no way limited to these examples.

FIGS. 16A and 16B show the front and back sides, respectfully, of portable programmable flip-open and foldable noise cancelation device 30. The portable programmable flip-open and foldable noise cancelation device 30 illustrated in FIG. 16A has the some embodiments shown and described in FIG. 4A and FIG. 4B. Illustrated in FIG. 16A is the speaker adjustment control 38, previously described herein, and the laser direction indicator light on/off control 27. The laser direction indicator light on/off control 27 turns the laser direction indicator lights 28 and 29 shown in FIG. 16B on and off. When laser direction indicator light on/off control 27 is turned on, the laser direction indicator lights 28 and 29 work in unison with the speaker adjustment control 38 and the broadcast of the inverted sound waves through speaker 33 as a guide to show the user the direction of the broadcasted inverted sound waves through the speaker 33 are directed. FIG. 16B shows the back side or speaker side of the portable programmable flip-open and foldable noise cancelation device 30 and the laser direction indicator light 28, which projects a laser light beam outward along the optimal upper end of the broadcasted inverted sound waves through the speaker 33. The laser direction indicator light 29 does the same as the laser direction indicator light 28, except on the optimal lower end of the broadcasted inverted sound waves. The laser direction indicator lights 28 and 29 work in unison with the speaker direction control 38, shown in FIG. 16A, to provide the user with the optimal upper and lower ends of where the inverted sound waves will broadcast, thereby providing the user with a customizable area within to optimally cancel, deaden, reduce unwanted sounds, noise, voices. When the speaker directional control 38 is moved up, the laser indicator lights 28 and 29 move up in unison, just as the direction of the speaker 33 broadcasts the inverted sound waves. As an example, a user may place the portable programmable flip-open and foldable noise cancelation device 30 in an area away from them, and the user can then utilize the laser direction indicator lights to see where the broadcasted inverted sound waves' upper and lower end will be, and if necessary, the user can adjust the area they want the inverted sound waves to be broadcast by adjust the speaker direction control 38 and simultaneously see the laser indicator lights 28 and 29 show where the broadcasting inverted sound waves will be directed. The portable programmable noise cancelation device and all its components, embodiments, microphones, and speakers may vary in feature function, number, shape, size, location, and the illustrations in FIGS. 16A, 16B are for illustrative purposes only and the noise cancelation device is in no way limited to these examples.

FIGS. 16C and 16D show the front and back sides, respectfully, of portable programmable flip-open and foldable noise cancelation device 39. The portable programmable flip-open and foldable noise cancelation device 39 illustrated in FIG. 16C has the some embodiments shown and described in FIG. 5A and FIG. 5B. Illustrated in FIG. 16C is the speaker adjustment control 38, previously described herein, and the laser direction indicator light on/off control 27. The laser direction indicator light on/off control 27 turns the laser direction indicator lights 28 and 29 shown in FIG. 16D, on and off. When laser direction indicator light on/off control 27 is turned on, the laser direction indicator lights 28 and 29 work in unison with the speaker adjustment control 38 and the broadcast of the inverted sound waves through speaker 33 as a guide to show the user the direction of the broadcasted inverted sound waves through the speaker 33 are directed. FIG. 16D shows the back side or speaker side of the portable programmable flip-open and foldable noise cancelation device 39 and the laser direction indicator light 28, which projects a laser light beam outward along the optimal upper end of the broadcasted inverted sound waves through the speaker 33. The laser direction indicator light 29 does the same as the laser direction indicator light 28, except on the optimal lower end of the broadcasted inverted sound waves. The laser direction indicator lights 28 and 29 work in unison with the speaker direction control 38, shown in FIG. 16C, to provide the user with the optimal upper and lower ends of where the inverted sound waves will broadcast, thereby providing the user with a customizable area within to optimally cancel, deaden, reduce unwanted sounds, noise, voices. When the speaker directional control 38 is moved up, the laser indicator lights 28 and 29 move up in unison, just as the direction of the speaker 33 broadcasts the inverted sound waves. As an example, a user may place the portable programmable flip-open and foldable noise cancelation device 39 in an area away from them, and the user can then utilize the laser direction indicator lights to see where the broadcasted inverted sound waves' upper and lower end will be, and if necessary, the user can adjust the area they want the inverted sound waves to be broadcast by adjust the speaker direction control 38 and simultaneously see the laser indicator lights 28 and 29 show where the broadcasting inverted sound waves will be directed. The portable programmable noise cancelation device and all its components, embodiments, microphones, and speakers may vary in feature function, number, shape, size, location, and the illustrations in FIGS. 16C, 16D are for illustrative purposes only and the noise cancelation device is in no way limited to these examples.

Figure 17:
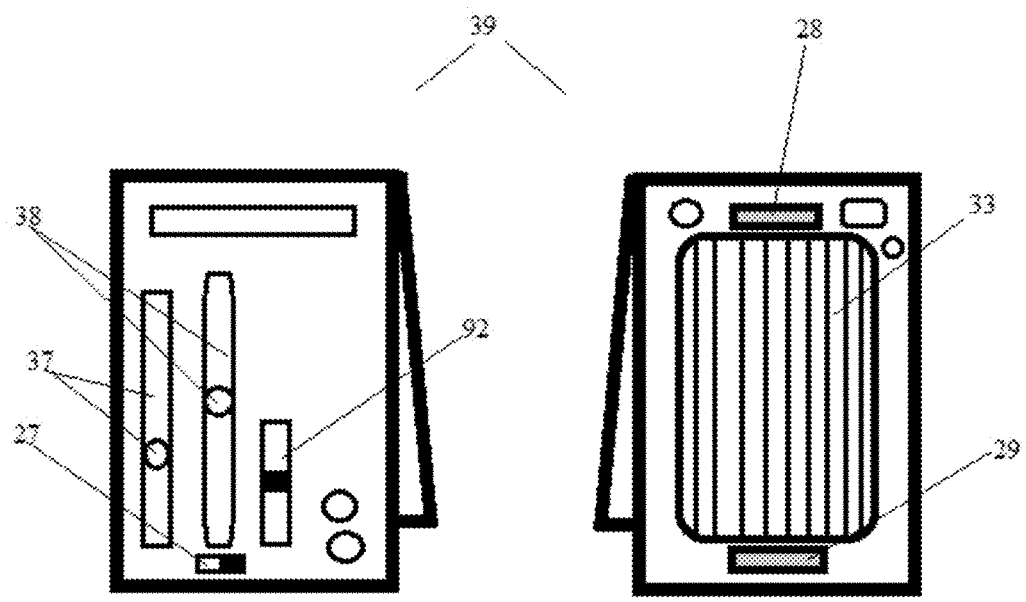
Figure 17:
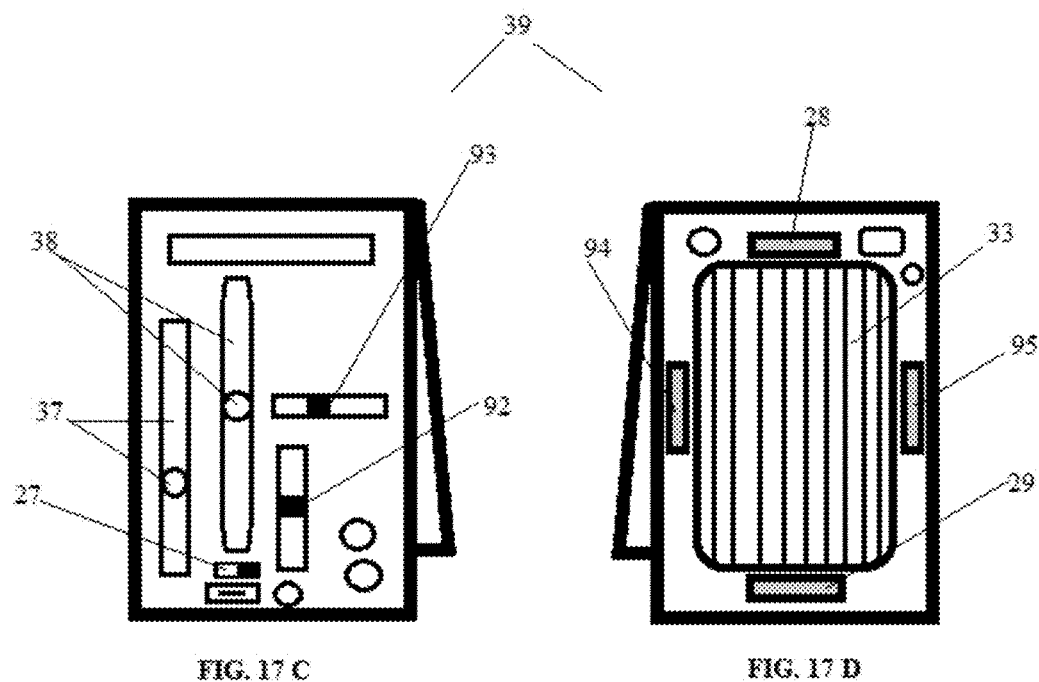

FIG. 17A shows the front side or microphone side of portable foldable noise cancelation device 39, previously illustrated and described in FIG. 5B, with the addition of the embodiments of the speaker direction laser indicator light on/off control 27 and the speaker upper/lower breadth control 92. The laser direction indicator light on/off control 27 is previously described and illustrated in FIGS. 16A and 16C. The speaker upper/lower breadth control 92, shown in FIGS. 17A and 17C, controls the breadth of the upper and lower ends of the broadcasting inverted sound waves through speaker 33, shown in FIGS. 17B and 17D. When the speaker upper/lower breadth control 92 is moved upward, the broadcasting inverted sound waves through speaker 33 widen in scope from the top and bottom, thereby providing a wider reception area of the broadcasting inverted sound waves through speaker 33. When the speaker upper/lower breadth control 92 is moved downward, the broadcasting inverted sound waves through speaker 33 narrow in scope from the top and bottom, thereby providing a narrower reception area of the broadcasting inverted sound waves through speaker 33. When the portable foldable noise cancelation device 39 has the embodiments or is equipped with the embodiments of the speaker direction control 38, the speaker direction laser indicator light on/off control 27, and the speaker upper/lower breadth control 92, and when the speaker direction laser indicator light on/off control 27 is turned on, the speaker direction laser indicator lights 28 and 29, shown in FIG. 17B, work in unison with the speaker direction control 38 and the speaker upper/lower breadth control 92 to project the laser lights in the direction of where the broadcasted inverted sound waves through speaker 33 will travel according to and corresponding to the aforementioned control selections. FIG. 17B shows the back side or speaker side of portable foldable noise cancelation device 39 with embodiments described and illustrated in FIG. 16B. With the additional embodiment of the speaker upper/lower breadth control 92 to the portable foldable noise cancelation device 39, the front and back sides of the portable foldable noise cancelation device 39 shown in FIGS. 17A and 17B, the speaker direction laser indicator light 28 projects its laser light at the upper side or end of the broadcasting inverted sound waves through speaker 33 and speaker direction laser indicator light 29 projects its laser light at the lower side or end of the broadcasting inverted sound waves through speaker 33 the breadth of which is controlled by the speaker upper/lower breadth control 92 and the angle of which is controlled by the speaker direction control 38. The speaker volume control 37 controls the loudness or volume of the broadcasting inverted sound waves through speaker 33.

FIG. 17B shows the back side or speaker side of portable foldable noise cancelation device 39 with embodiments described and illustrated in FIG. 16B. The embodiments of FIG. 17B are previously described in the FIG. 17A description.

FIG. 17C shows the front side or microphone side of the portable foldable noise cancelation device 39, with embodiments illustrated and described in FIG. 5B and FIG. 16C, with the addition of the embodiment of the speaker side-to-side narrow/wide breadth control 93. The speaker side-to-side narrow/wide breadth control 93 illustrated in FIG. 17C controls the breath of the inverted sound waves broadcasting through speaker 33, shown in FIG. 17D, with regard to the breadth from side to side. When the speaker side-to-side narrow/wide breadth control 93 is moved to the left, the inverted sound waves broadcasting the speaker 33 are broadcasted in a narrower scope, thereby providing a lessened area from left to right to receive the broadcasted inverted sound waves. When the speaker side-to-side narrow/wide breadth control 93 is moved to the right, the inverted sound waves broadcasting through speaker 33 are widened in scope from left to right, thereby providing a wider area of reception from left to right to receive the broadcasting inverted sound waves. When the portable foldable noise cancelation device 39 has the embodiments or is equipped with the embodiments of the speaker direction laser indicator light on/off control 27, and the speaker side-to-side narrow/wide breadth control 93, and when the speaker direction laser indicator light on/off control 27 is turned on, the speaker direction laser indicator lights 94 and 95, shown in FIG. 17D, work in unison with the side-to-side narrow/wide breadth control 93 to project the laser lights in the direction of where the broadcasting of inverted sound waves through speaker 33 will travel according to and corresponding to the aforementioned control selections, with the speaker direction laser indicator light 94 projecting on the left side and the speaker direction laser indicator light 95 projecting on the right side of broadcasting inverted sound waves through speaker 33. The speaker volume control 37 controls the loudness or volume of the broadcasting inverted sound waves through speaker 33.

FIG. 17D shows the back side or speaker side of portable foldable noise cancelation device 39 with embodiments described and illustrated in FIG. 16B, with the additional embodiments of the speaker direction laser indicator light 94 and the speaker direction laser indicator light 95. FIG. 17D embodiments are previously described in the FIG. 17C description.

FIGS. 18A, 18B, and 18C show side views of the portable foldable noise cancelation device 39. Illustrated in FIGS. 18A, 18B, 18C are the upper and lower ends of the broadcasting zone of the inverted sound waves 114 from speaker 33 in direct correlation to the speaker adjustment control 38, shown and described most recently in FIG. 17C. Illustrated in FIG. 18A is the straight forward direction of the broadcasting of inverted sound waves 114 from speaker 33, with the upper and lower ends of the broadcasting of inverted sound waves 114 projecting straight forward when the speaker adjustment control 38 is positioned in the middle. FIG. 18B illustrates the downward direction of the broadcasting of inverted sound waves 114 from speaker 33, with the upper and lower ends of the broadcasting of inverted sound waves 114 projecting downward when the speaker adjustment control 38 is moved downward and/or is positioned in the lower realm of the control. FIG. 18C illustrates the upward direction of the broadcasting of inverted sound waves from speaker 33, with the upper and lower ends of the broadcasting of inverted sound waves 114 projecting upward when the speaker adjustment control 38 is moved upward and/or is positioned in the upper realm of the control.

FIGS. 19A, 19B, and 19C show side views of the portable foldable noise cancelation device 39. Illustrated in FIGS. 19A, 19B, and 19C are the upper and lower ends of the broadcasting zone of the inverted sound waves 114 from speaker 33 in direct correlation to the speaker upper/lower breadth control 92, shown and described in FIGS. 17A and 17C, as related to the upper and lower ends of the broadcasting area of inverted sound waves through speaker 33. The speaker upper/lower breadth control 92 controls the breadth of the upper and lower ends of the broadcasting inverted sound waves through speaker 33. FIG. 19A illustrates when the speaker upper/lower breadth control 92 is in the middle of the control or neutral position, the broadcasting of the inverted sound waves through speaker 33 remain in the normal scope from the top and bottom as shown by the upper and lower ends of the broadcasting of inverted sound waves 114. Illustrated in FIG. 19B is when the speaker upper/lower breadth control 92 is moved upward, the broadcasting inverted sound waves through speaker 33 widen in scope from the top and bottom, as shown by the upper and lower ends of the broadcasting inverted sound waves 114, thereby providing a wider reception area of the broadcasting of inverted sound waves from speaker 33. FIG. 19C illustrates when the speaker upper/lower breadth control 92 is moved downward, the broadcasting inverted sound waves through speaker 33 narrow in scope from the top and bottom, as shown by the upper and lower ends of the broadcasting inverted sound waves 114, thereby providing a narrower reception area of the broadcasting of inverted sound waves through speaker 33.

FIGS. 19D, 19E, and 19F show side views of the portable foldable noise cancelation device 39. Illustrated in FIGS. 19D, 19E, and 19F is the direct correlation between the speaker adjustment control 38, recently shown and described in FIGS. 17A and 17C, the laser direction indicator lights on/off control 27, recently shown and described in FIGS. 17A and 17C, the laser direction indicator lights 28 and 29, recently shown and described shown in FIG. 17B, and the speaker upper/lower breadth control 92, shown and described in FIGS. 17A and 17C. For the laser direction indicator lights 28 and 29 to be activated, the laser direction indicator lights control 27 is turned on, as illustrated and described in FIGS. 17A and 17C. Illustrated in FIG. 19D is the upper/lower ends of the broadcasting of inverted sound waves 114 from the speaker 33, and the laser direction indicator lights 28 and 29 as they beam or project the upper laser light projection 115 and the lower laser light projection 116, respectively, in a straight forward direction when the speaker adjustment control 38 is in the middle of the control or neutral position, thereby the upper/lower ends of inverted sound waves 114 broadcasting from the speaker 33 project in the normal or straight forward direction, and the laser direction indicator lights 28 and 29 beam or project the upper laser light projection 115 and the lower laser light projection 116 at the upper and lower ends of the upper/lower ends of inverted sound waves 114, respectively, broadcasting from the speaker 33. This embodiment allows the user to see or illuminate the upper and lower ends of the projected area to receive the inverted sound waves, thus giving the user the see where the inverted sound waves will be projected/broadcast, as sound waves cannot be seen. As previously described in previous paragraphs herein, when the laser direction indicator lights control 27 is turned on, the laser direction indicator lights 28 and 29 move in unison to the projected inverted sound waves 114 from the speaker 33 when the speaker adjustment control 38 is adjusted, thereby the upper laser light projection 115 and the lower laser light projection 116 illustrate where the upper end and lower end of the reception area of the broadcasting of inverted sound waves from speaker 33. The speaker upper/lower breadth control 92, shown in FIGS. 17A and 17C, controls the breadth of the upper and lower ends of the broadcasting inverted sound waves through speaker 33, and when the laser direction indicator lights control 27 is turned on, the laser direction indicator lights 28 and 29 move in unison to the projected inverted sound waves 114 from the speaker 33 when the speaker upper/lower breadth control 92 is adjusted, thereby the upper laser light projection 115 and the lower laser light projection 116 illustrate where the upper end and lower end of the reception area of the broadcasting of inverted sound waves from speaker 33, as illustrated in FIG. 19D. FIGS. 19E and 19F illustrate the wider broadcast breadth area and narrower broadcast breadth area, respectfully, from the top and bottom of the broadcasting inverted sound waves from speaker 33, with the upper and lower ends of the broadcasting of inverted sound waves 114 projecting wider in breadth and narrower in breadth when the speaker upper/lower breadth control 92 is moved to the right for a wider broadcast breadth area and moved to the left for narrower broadcast breadth area, and/or when the speaker upper/lower breadth control 92 is positioned in the right side or left side of the control. The upper and lower laser direction indicator lights 28 and 29 and the upper and lower laser light projections 115 and 116 act as previously described in FIG. 19D, with the exception that FIGS. 19E and 19F illustrate a wider and narrower breadth, respectively.

FIGS. 20A, 20B, and 20C show side views of the portable foldable noise cancelation device 39. Illustrated in FIGS. 20A, 20B, and 20C is the direct correlation between the speaker adjustment control 38, recently shown and described in FIGS. 16C and 16D, and the laser direction indicator lights 28 and 29, recently shown and described shown in FIGS. 16C and 16D. For the laser direction indicator lights 28 and 29 to be activated, the laser direction indicator lights control 27 is turned on, as illustrated and described in FIGS. 16C and 16D. Illustrated in FIG. 20A is the upper/lower ends of the broadcasting of inverted sound waves 114 from the speaker 33 and the laser direction indicator lights 28 and 29 as they beam or project the upper laser light projection 115 and the lower laser light projection 116, respectively, in a straight forward direction when the speaker adjustment control 38 is in the middle of the control or neutral position, thereby the upper/lower ends of inverted sound waves 114 broadcasting from the speaker 33 project in the normal or straight forward direction, and the laser direction indicator lights 28 and 29 beam or project the upper laser light projection 115 and the lower laser light projection 116 at the upper and lower ends of the upper/lower ends of inverted sound waves 114, respectively, broadcasting from the speaker 33. As previously described in previous paragraphs herein, when the laser direction indicator lights control 27 is turned on, the laser direction indicator lights 28 and 29 move in unison to the projected inverted sound waves 114 from the speaker 33 when the speaker adjustment control 38 is adjusted, thereby the upper laser light projection 115 and the lower laser light projection 116 illustrate where the upper end and lower end of the reception area of the broadcasting of inverted sound waves from speaker 33. FIGS. 20B and 20C illustrate the downward and upward direction, respectfully, of the broadcasting of inverted sound waves from speaker 33, with the upper and lower ends of the broadcasting of inverted sound waves 114 projecting downward and upward when the speaker adjustment control 38 is moved downward and upward and/or is positioned in the lower or upper realm of the control. The laser direction indicator lights 28 and 29 and the upper and lower laser light projections 115 and 116 act as previously described in FIG. 20A with the exception that the broadcasting area of inverted sound waves is downward and upward, respectively.

Figure 21:
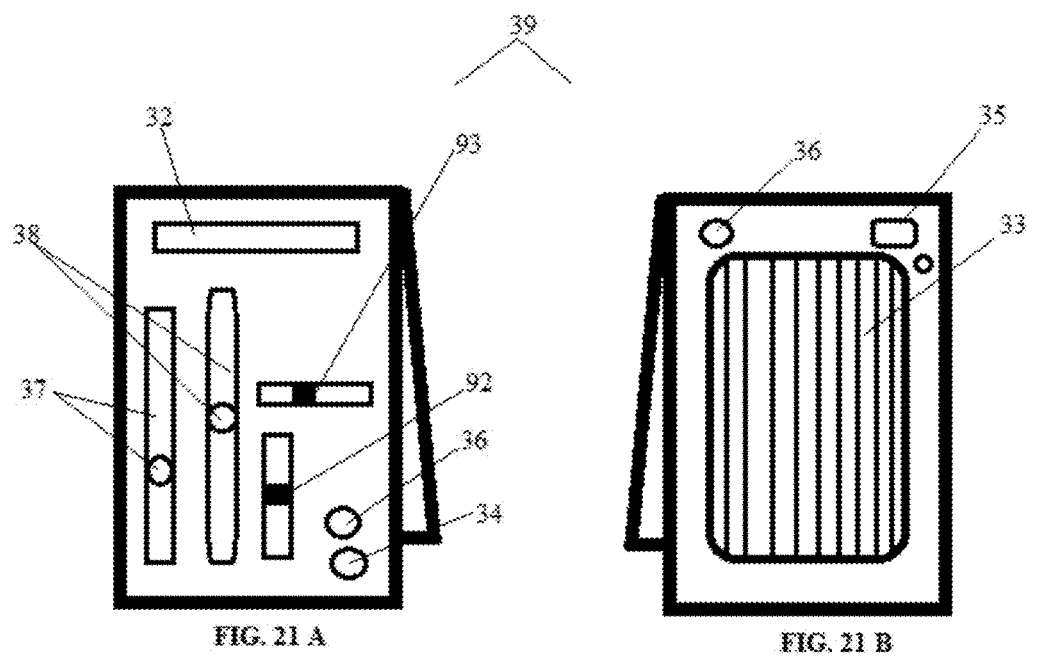
Figure 21:
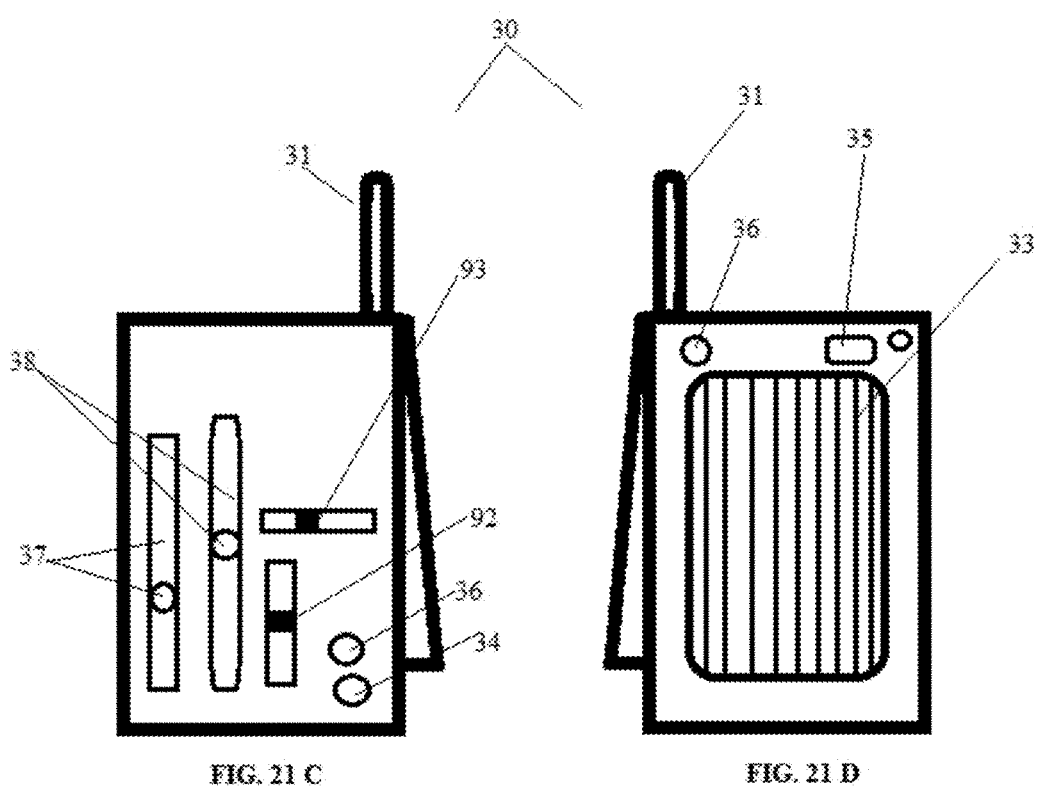

FIGS. 21A and 21B show front and back views, respectively, of the portable foldable noise cancelation device 39. Illustrated in FIG. 21A are embodiments that can be included and operated into and onto the portable foldable noise cancelation device 39, all previously illustrated and described, but not illustrated with the portable foldable noise cancelation device 39.

FIGS. 21C and 21D show front and respectively, of the portable foldable noise cancelation device 30. Illustrated in FIG. 21C are embodiments that can be included and operated into and onto the portable foldable noise cancelation device 30, all previously illustrated and described, but not illustrated with the portable foldable noise cancelation device 30.

FIG. 22 shows an example of the side view of the portable foldable noise cancelation device 39. Illustrated in FIG. 22 is an open hotel window 120 and noise from the outside of which the sound waves of the unwanted noise 121 enter through the hotel window 120 and toward the portable foldable noise cancelation device 39 in open position resting over the back of a chair 122, with the microphone 32 facing the hotel window 120 and the unwanted noise sound waves 121. The portable foldable noise cancelation device 39 receives the unwanted noise sound waves into the microphone 32 and instantaneously the portable foldable noise cancelation device 39 inverts the received unwanted noise sound waves 121 and broadcasts the inverted sound waves 123, of the unwanted noise sound waves 121, through the speaker 33 of the portable foldable noise cancelation device 39 toward the person 124 sleeping on the bed 125. The inverted sound waves 123 cancel the unwanted noise sound waves 121 through proven scientific research. As previously discussed in FIGS. 18A-C, 19A-C, 19D-F, 20A-20C, the breadth and broadcast area of the inverted sound waves from the portable foldable noise cancelation device 39 creates an area of which the unwanted noise is canceled, deadened, reduced, thereby providing the person sleeping 124 with a quiet area. FIG. 22 is an example of one scenario in which the portable foldable noise cancelation device 39 can be used and does not limit in any way the portable foldable noise cancelation device 39 or other noise cancelation devices discussed, implied, shown, to the example given in FIG. 22, or any other FIGS. herein.

The noise cancelation devices described herein have the ability to program or record and save sounds or noise and their respective sound waves within the noise cancelation device and then create the respective inverted sound waves and broadcasts the inverted sound waves thereby reducing, deadening or canceling the original sounds or noise. The noise cancelation devices described herein also allow for real-time sound and noise cancelation utilizing the same process of sound or noise cancelation. The process of sound and noise cancelation is known to those familiar with active noise cancelation. Machines, hairdryers, vacuum cleaners and other devices that create a steady sound or noise also create a steady or known sound wave pattern, decibel level, etc., and thus the ability to program these sound waves into the noise cancelation device and to invert the sound waves and broadcast the inverted sound waves will reduce, deaden, or cancel the original sounds, thereby creating an environment that has reduced noise or unwanted sounds in the environment and relieve the stress and pain of the aforementioned sounds or noise. This is highly necessary in a manufacturing plant/warehouse, as an example. Another example may be in a hotel room where the use of a hairdryer creates a noisy room and is also bad for the ears at the decibel levels emitted. The preprogrammed noise cancelation of the noise cancelation device would relieve the user and others in the room of the loud noise and reduce the damage from the decibel levels.

Referring to the ability to reduce, deaden, or cancel noise in a manufacturing warehouse, the noise cancelation devices described herein allow for the constant noise level and related sounds waves to be programmed into the noise cancelation device, the sound waves inverted and then broadcast through speakers positioned throughout the warehouse, built into the walls, floors or ceilings and utilizing speakers such as directional speakers or speakers systems, all used to broadcast the inverted sound waves, thereby reducing, deadening, or canceling the machine noise. This will allow people to converse and work in the warehouse without having to wear earplugs or headsets as well as reduce the effects of the noise and decibel levels emitted from the machines.

Referring to the ability to preprogram sounds or noise and allow the noise cancelation devices described herein to broadcast the inverted sound waves of the preprogrammed sounds or noise, the noise cancelation devices described herein allow for the ability to be turned on and off using a wall switch, remote control, or other means to turn on and off the noise cancelation device. As an example, if the noise cancelation device is utilized in a machine warehouse, the noise cancelation device may be turned on from a switch on the wall, much like a light switch turns on the lights within a room, therefore the noise cancelation device may be turned on prior to the machines being turned on, allowing for a reduced, deadened, or noise-free environment. Further, the noise cancelation device may be turned on after the machines have begun to operate and emit their unwanted noise, and thus when the noise cancelation device is turned on, the unwanted noise will be reduced, deadened, or cancelled, providing a better work environment.

Referring to the ability of the noise cancelation devices described herein to utilize portable microphones, a person may be wearing a microphone that receives sounds or noise around the person, transmits to the noise cancelation device which immediately inverts the sound waves and immediately broadcasts the inverted sound waves through directional speakers that track or follow the person wearing the portable microphone, thus resulting in the noise around the person wearing the portable microphone to be reduced, deadened, or cancelled.

The portable version of the noise cancelation device allows for the ability to carry the noise cancelation device to a restaurant, office, a gathering, or any place a person may desire to reduce, deaden, or cancel sounds to allow them to converse or be in a noise-free or unwanted sound-free environment. An example of this would be two people sitting at a table in a noisy restaurant and not being able to have a conversation without raising their voices, and even then they have difficulty hearing one another and the experience is less than desirable. The portable programmable version of the noise cancelation device allows the two people to place the noise cancelation device on the table, turn it on, raise the telescopic microphones, and while both remain silent and do not speak, they turn on the program or record control for a few moments and then turn the record or program control off. While the record or program control was turned on, the microphone received the sounds that were travelling past the two people and recorded or programmed those sounds into the noise cancelation device. When the record or program control was turned off, the noise cancelation device immediately created the inverted sound wave from the respective sounds travelling past the two people, and now the noise cancelation device broadcasts the inverted sound waves from the directional speakers, thereby reducing, deadening, or canceling the unwanted sounds that were programmed into the noise cancelation device. The volume of the broadcasted inverted sound waves may be raised or lower using the volume control. Also, the angle of and the direction of the directional speakers may be altered or adjusted by using the respective control on the noise cancelation device, thereby allowing the person the ability to maximize the reducing, deadening, and canceling of the unwanted noise.

Referring to the ability of the noise cancelation device to turn on and off automatically, the noise cancelation device may include a sensor to detect a preprogrammed noise and when detected, the sensor immediately activates or turns-on the noise cancelation device. Further, the sensor will detect the absence of the preprogrammed noise and when the noise is not present, the sensor deactivates or turns-off the noise cancelation device.

Referring to the microphones of the noise cancelation device, which may be directional, conventional, a combination of both. The noise cancelation device may utilize portable or wearable microphones, aforementioned, to receive sounds and noise, and allow the noise cancelation device to program or record and save those sounds and noise, and then the sound waves of the received sounds and noise will be immediately inverted and then broadcast through speakers, thereby reducing, deadening, or canceling the previously received sounds and noise, which are unwanted by the user.

Referring to the portable version of the noise cancelation device which may utilize programmable or active noise reducing, deadening, and canceling technology. The noise or cancelation device may utilize active noise canceling technology within its portable device, thereby reducing, deadening, or canceling the sounds or noise in the area desired. The portable version allows the noise cancelation device to be placed in a location and immediately utilize active noise cancelation technology to immediately invert the unwanted sounds or noise sound waves and immediately broadcast the inverted sound waves through the speakers and reduce, deaden, or cancel the unwanted sounds or noise. Further, the portable version of the noise cancelation device can utilize the programmable or record and save ability when desired to reduce, deaden, or cancel unwanted sounds or noise.

The noise cancelation device may utilize A/C, D/C, rechargeable batteries, non-rechargeable batteries, all other power sources presently invented or to be invented in the future. The noise cancelation device may use a combination of power sources to operate.

The noise cancelation device uses the inverting of sound waves and broadcasting of the inverted sound waves to cancel its respective sound wave. The physics and science of the canceling of sound is known. The noise cancelation device may utilize a microchip, nanochip, microprocessor, nanoprocessor, amplifier, memory mechanism, computer processor, and other such technology needed to operate the noise cancelation device and any device associated with or used in conjunction with the noise cancelation device.

The noise cancellation device may utilize active noise cancelation, recorded or programmed and saved noise cancelation, and preprogrammed noise cancelation in each device or alone in a device or in any combination in one device or multiple devices. Further the noise cancelation device allows the ability to use active noise cancelation in its portable version as well as record, program and save, and preprogrammed noise cancelation.

The noise cancelation device allows for a person's voice qualities or persons' voice qualities, including frequency and all qualities of their voice(s), to be recorded and saved or programmed into the noise cancelation device. Then when the noise cancelation device is activated, it may only allow the preprogrammed voice(s) and their respective voice qualities to be heard, and thereby reducing, deadening, or canceling all other sounds and/or voices. Thus the noise cancelation device allows for certain sounds to be heard and the ability to reduce, deaden, or cancel all others in the area.

In some circumstances such as using a portable version of the noise cancelation device at a restaurant, the portable noise cancelation device can be used to create a quiet area or cocoon of noise reduction for the table area.

Referring to the noise cancelation device and its ability to reduce, deaden, or cancel unwanted sound or noise in a machine or manufacturing warehouse where the noise of the machine is loud and constant, the noise cancelation device allows for the room or certain locations to have noise reduced, deadened, or canceled, depending on the speakers used in conjunction with the noise cancelation device and the area desired to have reduce, deadened, or canceled noise. Directional speakers may be used for specific areas or to follow an individual or individuals who wear a microphone that has a tracking mechanism. The speakers may be plentiful and throughout the warehouse, either standing alone, together or built into the walls, floors, ceilings, or in any combination, thereby reducing, deadening, or canceling unwanted noise in a more broad scope.

The noise cancelation device allows for the activation of or deactivation of, the turning on and off, as well as programmability and full usage of the noise cancelation device to be available and controlled by a program or application that may be used by/on a "smart phone", mobile phone, tablet, computer, or other device invented or to be invented in the future. The noise cancelation device allows for commercial buildings, restaurants, and other locations where sounds or noise may be desired to be reduced, deadened, or canceled. The noise cancelation device allows for speakers to be built-into walls, floors, and ceilings and to utilize the microphones, portable, fixed, hung, or other, of the noise cancelation device, and the use of the programmable sound and noise reducing, deadening, and canceling technology. The noise cancelation device may be used anywhere and in any environment.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A portable noise cancellation device, comprising:
a housing with first and second housing portions that are pivotally connected to one another along common first ends by a hinge to allow the first and second housing portions to pivot relative to one another between a closed orientation where the first and second housing portions are substantially parallel to one another and an open, V-shaped orientation where the first and second housing portions are disposed at an angle relative to one another;
the first and second housing portions each include a first side and a second side, the first sides face each other in both the closed orientation and the open, V-shaped orientation, and the second sides face away from one another in both the closed orientation and the open, V-shaped orientation;

at least one battery in the housing for providing electrical power;

memory in the housing, the memory storing data of at least one sound in the ambient around the noise cancellation device;

a speaker on the second side of the first housing portion from which sounds stored in the memory can be broadcast outwardly from the second side of the first housing portion;

one of:
- a microphone on the second side of the second housing portion through which sounds can be recorded and stored in the memory, the microphone faces in a direction that is opposite a direction that the speaker faces; or
- a telescopic support connected to the housing and a microphone on the telescopic support through which sounds can be recorded and stored in the memory;

a volume control on the housing that controls the volume of sounds broadcast from the speaker;

a record button on the housing that permits recording of sounds through the microphone;

an inverting circuit connected to the memory that inverts sounds stored in the memory before the sounds are broadcast from the speaker or that inverts sounds recorded through the microphone before the sounds are stored in the memory in inverted form.

2. The portable noise cancellation device of claim 1, comprising a single said speaker on the second side of the first housing portion, the single speaker is controllable to change the direction of projection of sound therefrom, and comprising a speaker direction control on the housing that permits user adjustment of the speaker broadcast direction.

3. The portable noise cancellation device of claim 2, wherein the speaker direction control is on the second side of the second housing portion.

4. The portable noise cancellation device of claim 1, comprising a single said speaker on the second side of the first housing portion, the single speaker is controllable to change the breadth of projection of sound therefrom, and comprising a speaker breadth control on the housing that permits user adjustment of the speaker breadth.

5. The portable noise cancellation device of claim 4, wherein the speaker breadth control is on the second side of the second housing portion.

6. The portable noise cancellation device of claim 1, wherein the speaker occupies a majority of an area of the second side of the first housing portion.

7. The portable noise cancellation device of claim 1, further comprising an allow only feature that allows a user to select a noise to be heard with the portable cancellation device cancelling all other noises, and an allow only control on the housing that permits the allow only feature to be user controlled.

8. A portable noise cancellation device, comprising:

a housing having a first side and a second side that faces in a direction opposite the first side;

at least one battery in the housing for providing electrical power;

memory in the housing, the memory storing data of at least one sound in the ambient around the noise cancellation device;

a speaker on the first side of the housing from which sounds stored in the memory can be broadcast outwardly from the first side of the housing;

one of:
- a microphone on the second side of the housing through which sounds can be recorded and stored in the memory, the microphone faces in a direction that is opposite a direction that the speaker faces; or
- a telescopic support connected to the housing and a microphone on the telescopic support through which sounds can be recorded and stored in the memory;

a volume control on the housing that controls the volume of sounds broadcast from the speaker;

a record button on the housing that permits recording of sounds through the microphone;

an inverting circuit connected to the memory that inverts sounds stored in the memory before the sounds are broadcast from the speaker or that inverts sounds recorded through the microphone before the sounds are stored in the memory in inverted form.

9. The portable noise cancellation device of claim 8, comprising a single said speaker on the first side of the housing, the single speaker is controllable to change the direction of projection of sound therefrom, and comprising a speaker direction control on the housing that permits user adjustment of the speaker broadcast direction.

10. The portable noise cancellation device of claim 9, wherein the speaker direction control is on the second side of the housing.

11. The portable noise cancellation device of claim 8, comprising a single said speaker on the first side of the housing, the single speaker is controllable to change the breadth of projection of sound therefrom, and comprising a speaker breadth control on the housing that permits user adjustment of the speaker breadth.

12. The portable noise cancellation device of claim 11, wherein the speaker breadth control is on the second side of the housing.

13. The portable noise cancellation device of claim 8, wherein the speaker occupies a majority of an area of the first side of the housing.

14. The portable noise cancellation device of claim 8, further comprising an allow only feature that allows a user to select a noise to be heard with the portable cancellation device cancelling all other noises, and an allow only control on the housing that permits the allow only feature to be user controlled.

15. A portable noise cancellation device, comprising:

a housing having a top surface, a bottom surface opposite the top surface, and sides that interconnect the top and bottom surfaces;

at least one battery in the housing for providing electrical power;

memory in the housing, the memory storing data of at least one sound in the ambient around the noise cancellation device;

a speaker on and projecting above the top surface of the housing from which sounds stored in the memory can be broadcast;

a telescopic support on and projectable above the top surface of the housing;

a microphone on the telescopic support through which sounds can be recorded and stored in the memory;

a volume control on the housing that controls the volume of sounds broadcast from the speaker;

a record button on the housing that permits recording of sounds through the microphone;

an inverting circuit connected to the memory that inverts sounds stored in the memory before the sounds are broadcast from the speaker or that inverts sounds recorded through the microphone before the sounds are stored in the memory in inverted form.

16. The portable noise cancellation device of claim 15, comprising a plurality of the speakers on and projecting above the top surface of the housing.

17. The portable noise cancellation device of claim 15, wherein the speaker is controllable to change the direction of projection of sound therefrom, and comprising a speaker direction control on one of the sides of the housing that permits user adjustment of the speaker broadcast direction.

18. The portable noise cancellation device of claim 15, wherein the speaker is controllable to change the breadth of projection of sound therefrom, and comprising a speaker breadth control on one of the sides of the housing that permits user adjustment of the speaker breadth.

19. The portable noise cancellation device of claim 15, further comprising an allow only feature that allows a user to select a noise to be heard with the portable cancellation device cancelling all other noises, and an allow only control on one of the sides of the housing that permits the allow only feature to be user controlled.

20. The portable noise cancellation device of claim 15, wherein the microphone is extendable by the telescopic support to a position vertically above a topmost end of the speaker.

\* \* \* \* \*